United States Patent
LaRue et al.

(10) Patent No.: US 10,720,928 B1
(45) Date of Patent: Jul. 21, 2020

(54) FREQUENCY AGILE MODULATOR

(71) Applicant: Government of the United States, as represented by the Secretary of the Air Force, Wright-Patterson AFB, OH (US)

(72) Inventors: Matthew LaRue, Columbus, OH (US); Waleed Khalil, Dublin, OH (US); Tony Quach, Lebanon, OH (US); Brian Dupaix, Columbus, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 0 days.

(21) Appl. No.: 16/299,213

(22) Filed: Mar. 12, 2019

(51) Int. Cl.
*H03L 7/081* (2006.01)
*H04L 27/36* (2006.01)
(Continued)

(52) U.S. Cl.
CPC .............. *H03L 7/081* (2013.01); *G06F 1/10* (2013.01); *H03K 19/20* (2013.01); *H04L 27/36* (2013.01)

(58) Field of Classification Search
None
See application file for complete search history.

(56) References Cited

U.S. PATENT DOCUMENTS 5,463,337 A 10/1995 Leonowich
5,790,612 A 8/1998 Chengson et al.
(Continued)

OTHER PUBLICATIONS

Gheidi, H., et al., "A 1-3 GHz Delta—Sigma-Based Closed-Loop Fully Digital Phase Modulator in 45-nm CMOS SOI," IEEE Journal of Solid-State Circuits, vol. 52, Issue 5, May 2017, pp. 1185-1195.
(Continued)

*Primary Examiner* — Lincoln D Donovan
*Assistant Examiner* — Khareem E Almo
(74) *Attorney, Agent, or Firm* — AFMCLO/JAZ; Adam Pugh

(57) ABSTRACT

A frequency-agile phase modulator with glitch-free multiplexer in CMOS process technologies for applications including wireless communications, radar, automotive radar, etc. Examples herein offer a novel phase modulator architecture that, when combined with either a wideband power amplifier or multiple narrowband amplifiers, allows for a single transmitter to transmit radar, communication, telemetry, or other similar waveforms across multiple frequency bands. The embodiments herein allow one transmitter to cover a very large operating frequency range, resulting in a decrease in size, weight, power consumption, and cost for future "small" platform systems. In an embodiment, the phase modulator circuit includes a reconfigurable delay-locked loop (DLL) circuit that is configured to receive a radio frequency (RF) input signal ($RF_{in}$) and a configuration signal. The phase modulator circuit also includes a frequency-agile, glitch-free multiplexer circuit configured to receive an oversampled baseband clock signal ($clk_{OBB}$) and a phase select data input signal.

17 Claims, 19 Drawing Sheets

(51) Int. Cl.
*H03K 19/20* (2006.01)
*G06F 1/10* (2006.01)

(56) References Cited

U.S. PATENT DOCUMENTS

| | | | |
|---|---|---|---|
| 6,008,680 | A | 12/1999 | Kyles et al. |
| 6,037,812 | A | 3/2000 | Gaudet |
| 6,100,735 | A | 8/2000 | Lu |
| 6,891,774 | B1 | 5/2005 | Abdollahi-Alibeik et al. |
| 6,919,749 | B2 | 7/2005 | Alon et al. |
| 6,982,579 | B2 | 1/2006 | Lee |
| 6,995,554 | B2 | 2/2006 | Loke et al. |
| 7,162,000 | B2 * | 1/2007 | Stengel ............ H03K 7/04 327/141 |
| 7,236,028 | B1 | 6/2007 | Choi |
| 7,254,208 | B2 | 8/2007 | Tomerlin et al. |
| 7,323,915 | B2 | 1/2008 | Josephson |
| 7,443,941 | B2 | 10/2008 | Farjad-Rad |
| 7,460,565 | B2 | 12/2008 | Dally et al. |
| 7,715,493 | B2 * | 5/2010 | Ravi ............ H03F 3/217 375/296 |
| 8,044,742 | B2 | 10/2011 | Sun |
| 8,188,766 | B1 | 5/2012 | Cheah et al. |
| 8,289,056 | B2 | 10/2012 | Xu et al. |
| 8,933,735 | B2 | 1/2015 | Kropp et al. |
| 9,178,502 | B2 | 11/2015 | Francom et al. |
| 9,360,883 | B1 | 6/2016 | Barman et al. |
| 9,596,037 | B2 | 3/2017 | Hsueh et al. |
| 9,716,507 | B1 * | 7/2017 | Nummer ............ H03L 7/0991 |
| 9,720,438 | B2 | 8/2017 | Lee et al. |
| 10,020,032 | B2 | 7/2018 | Whetsel |
| 2009/0036064 | A1 * | 2/2009 | Ravi ............ H03C 3/40 455/76 |
| 2009/0041108 | A1 * | 2/2009 | Degani ............ H04L 25/4902 375/238 |
| 2010/0111227 | A1 * | 5/2010 | Philippe ............ H03C 5/00 375/300 |
| 2012/0161835 | A1 * | 6/2012 | David ............ H03L 7/146 327/157 |

OTHER PUBLICATIONS

Cho, K., et al., "A Digitally Intensive Transmitter/PA Using RF-PWM With Carrier Switching in 130 nm CMOS," IEEE Journal of Solid-State Circuits, vol. 51, No. 5, May 2016, pp. 1188-1199.

Ravi, A., et al., "A 2A-GHz 20-40-MHz Channel WLAN Digital Outphasing Transmitter Utilizing a Delay-Based Wideband Phase Modulator in 32-nm CMOS," IEEE Journal of Solid-State Circuits, vol. 47, No. 12, Dec. 2012, pp. 3184-3196.

* cited by examiner

FREQUENCY AGILE MODULATOR

GOVERNMENT INTEREST

The invention described herein may be manufactured and used by or for the Government of the United States for all government purposes without the payment of any royalty.

BACKGROUND

Field of the Invention

The embodiments herein relate to electronic devices and circuits, and more particularly to phase modulator circuits for use in radar, automotive radar, communications, telemetry, or other similar applications.

Background of the Invention

Modulator circuits are essential components of transmitters used in radar, automotive radar, communications, telemetry, and other similar applications. The growth of cellular and wireless communications over the last two decades has led to unprecedented congestion of the radio frequency (RF) spectrum. New frequency bands and bandwidth allocations are constantly being opened up to alleviate this congestion, but the demand for wireless data is increasing faster than spectrum availability. Currently available modulators generally operate over a frequency range that is too narrow to efficiently utilize the available spectrum.

There have been attempts to develop transmitters that cover multiple frequency bands by providing the transmitters with modulator circuits including multiple phase modulators, with each modulator tuned or optimized for a different frequency band. These digitally-intensive phase modulator circuits can produce a waveform nonideality known as a glitch that can degrade the modulation accuracy and increase the spectral noise floor of the phase modulator output. Additionally, such arrangements can increase the size, weight, complexity, power consumption, and cost requirements for transmitter systems. Current architectures that prevent glitches limit the maximum possible phase transition and utilize static phase delays, making them unsuitable for phase modulators that operate over multiple frequency bands.

Accordingly, current state of the art phase modulator architectures only cover a very small operating frequency range. If multiple phase modulators are used as part of a transmitter to cover multiple frequency bands, then glitches are introduced into the operation of the transmitter while increasing the size, weight, complexity, power consumption, and cost requirements for the transmitter system. This glitch may occur due to various reasons. Commercial companies utilize multiple transmitters to cover multiple frequency bands, which again suffer from increased size, weight, complexity, power consumption, and cost requirements.

BRIEF SUMMARY OF THE INVENTION

The embodiments herein provide a Frequency-Agile Phase Modulator with Glitch-Free Multiplexer implemented in CMOS Process Technologies for applications including, without limitation, wireless communications, radar, etc. The embodiments herein offer a novel phase modulator architecture that, when combined with either a wideband power amplifier or multiple narrowband amplifiers, allows for a single transmitter to transmit radar, communication, telemetry, or other similar waveforms across multiple frequency bands.

The embodiments herein allow one transmitter to cover a very large operating frequency range, resulting in a decrease in size, weight, power consumption, and cost for future "small" platform systems.

An embodiment herein provides a phase modulator circuit comprising a reconfigurable delay-locked loop (DLL) circuit configured to receive a radio frequency (RF) input signal ($RF_{in}$) and a configuration signal, wherein the DLL is configured to produce a DLL output ($DLL_{out}$) over a plurality of RF bands; and a frequency-agile, glitch-free multiplexer circuit configured to receive an oversampled baseband clock signal ($clk_{OBB}$), a phase select data input signal for providing phase select data, and the multiplexer circuit being configured to receive the $DLL_{out}$ and to output a multiplexer output signal ($Mux_{out}$) based at least in part upon the phase select data and the $DLL_{out}$.

The DLL circuit may comprise a delay-line comprising a plurality of inverters, wherein each of the inverters has at least an input and an output. The DLL circuit may further comprise a frequency-select multiplexer ($Mux_{FSel}$), wherein the $Mux_{FSel}$ is configured to receive the configuration signal, wherein the $Mux_{FSel}$ has a plurality of electrical connections to the delay line and a $Mux_{FSel}$ output line that serves as a delay-line output, wherein each of the plurality of electrical connections to the delay line is to the output of a corresponding one of the plurality of inverters, wherein the delay line has a configurable effective delay line length, wherein the configuration signal configures the $Mux_{FSel}$ to adjust the effective length of the delay line by selecting the output of one of the inverters that have their outputs connected to the $Mux_{FSel}$ to serve as the delay-line output in the DLL.

The $MUX_{FSel}$ may have a plurality of inputs each connected by a respective one of the plurality of the electrical connections to the delay line, wherein the delay-line in the DLL circuit comprises thirty two inverters and the $Mux_{FSel}$ has at least one input connected to the output of the eighth inverter, at least one input connected to the output of the twelfth inverter, at least one input connected to the output of the sixteenth inverter, at least one input connected to the output of the twentieth inverter, at least one input connected to the output of the twenty fourth inverter, at least one input connected to the output of the twenty eighth inverter, and at least one input connected to the output of the thirty second inverter.

The $Mux_{FSel}$ may have a plurality of inputs each connected by a respective one of the plurality of electrical connections to the delay line, wherein there are four inverters between each pair of the plurality of the electrical connections from the $Mux_{FSel}$ to the delay line. The DLL may further comprise a current-mode logic (CML) divide-by-2 element used to provide a low phase noise RF signal at one half the frequency of the RF input signal ($RF_{in}$), the low phase noise RF signal serving as input to the delay line and as a reference signal to a first inverter outside the delay line, the first inverter outside the delay line having an output; and a phase detector, the output of the first inverter outside the delay line being electrically connected to one input of the phase detector via a replica multiplexer ($Mux_{rep}$), the delay-line output being electrically connected to another input of the phase detector, the $Mux_{rep}$ providing a delay in the reference signal to match the delay due to the $Mux_{FSel}$ in the delay-line output.

The DLL may further comprise a charge pump having inputs and outputs; and a loop filter having inputs and outputs, wherein the phase detector has outputs, the outputs of the phase detector being electrically connected to the inputs of the charge pump, the outputs of the charge pump being electrically connected to the inputs of the loop filter, and the outputs of the loop filter being electrically connected to the bias voltage of each of the inverters in the delay line. The $DLL_{out}$ may comprise a plurality of signal paths, the output of every other inverter in the delay line, beginning with the first inverter in the delay line and ending with the next to the last invertor in the delay line, being electrically connected to a respective one of the plurality of signal paths in the $DLL_{out}$ via a corresponding inverter outside the delay line.

The multiplexer circuit may comprise a first multiplexer and a second multiplexer, wherein each of the first multiplexer and the second multiplexer has inputs and at least one output, wherein the phase select data includes at least a current phase select data and a next phase select data, wherein the first multiplexer receives the $DLL_{out}$ as a first input and the current phase select data as a second input and produces the $Mux_{out}$ as an output, wherein the current phase select data modulates the $DLL_{out}$ to produce the $Mux_{out}$, wherein the second multiplexer receives the $DLL_{out}$ as a first input and the next phase select data as a second input and produces as an output a second multiplexer output ($OUT_{next}$), and wherein the next phase select data modulates the $DLL_{out}$ to produce the $OUT_{next}$.

The multiplexer circuit may comprise a NOR gate having at least first and second inputs and at least an output, wherein the $Mux_{out}$ is routed through a branching path, with one branch conducting $Mux_{out}$ as output of the multiplexer circuit and another branch conducting $Mux_{out}$ to the first input of the NOR gate, wherein the $OUT_{next}$ is conducted to the second input of the NOR gate and the output of the NOR gate is used in generating a glitch-free clock signal ($clk_{GF}$) for loading the next phase select data to the first multiplexer at a time such that glitches are avoided.

The multiplexer circuit may further comprise an AND gate having at least first and second inputs and at least an output, wherein the output of the NOR gate is routed to the first input of the AND gate, and a data change signal ($data_{change}$), which indicates that the phase select data has changed from one oversampled baseband period to the next when $data_{change}$ is high, is conducted to the second input of the AND gate, and the output of the AND gate provides the $clk_{GF}$.

The multiplexer circuit may further comprise data holding circuitry at least receiving $clk_{GF}$ and phase select data as inputs and providing at least the current phase select data and the next phase select data as outputs to the first and second multiplexers, respectively, at least in part in response to $clk_{GF}$. The data holding circuitry may comprise at least one flip-flop.

Another embodiment provides a transmitter circuit comprising a phase modulator circuit comprising a reconfigurable DLL circuit configured to receive a radio frequency input signal ($RF_{in}$) and a configuration signal, wherein the DLL is configured to produce a DLL output ($DLL_{out}$) over a plurality of RF bands; and a frequency-agile, glitch-free multiplexer circuit configured to receive an oversampled baseband clock signal ($clk_{OBB}$), a phase select data input signal for providing phase select data, and the multiplexer circuit being configured to receive the $DLL_{out}$ and to output a multiplexer output signal ($Mux_{out}$) based at least in part upon the phase select data and the $DLL_{out}$. The transmitter circuit further comprises a power amplifier having at least an input and an output, wherein the input to the power amplifier is based at least in part on the $Mux_{out}$.

The transmitter circuit may further comprise a buffer circuit for processing a signal based at least on $Mux_{out}$ to provide a buffer circuit output signal that is suitable as an input signal to the power amplifier. The multiplexer circuit may comprise a first multiplexer and a second multiplexer, wherein each of the first multiplexer and the second multiplexer has inputs and at least one output, wherein the phase select data includes at least a current phase select data and a next phase select data, wherein the first multiplexer receives the $DLL_{out}$ as a first input and the current phase select data as a second input and produces the $Mux_{out}$ as an output, wherein the current phase select data modulates the $DLL_{out}$ to produce the $Mux_{out}$, and wherein the second multiplexer receives the $DLL_{out}$ as a first input and the next phase select data as a second input and produces as an output a second multiplexer output ($OUT_{next}$), wherein the next phase select data modulates the $DLL_{out}$ to produce the $OUT_{next}$. The multiplexer circuit may comprise a NOR gate having at least first and second inputs and at least an output, wherein $Mux_{out}$ is routed through a branching path, with one branch conducting $Mux_{out}$ as output of the multiplexer circuit and another branch conducting $Mux_{out}$ to the first input of the NOR gate, wherein $OUT_{next}$ is conducted to the second input of the NOR gate and the output of the NOR gate is used in generating a glitch-free clock signal ($clk_{GF}$) for loading the next phase select data to the first multiplexer at a time such that glitches are avoided.

The multiplexer circuit may further comprise an AND gate having at least first and second inputs and at least an output, wherein the output of the NOR gate is routed to the first input of the AND gate and a data change signal ($data_{change}$), which indicates that the phase select data has changed from one oversampled baseband period to the next when $data_{change}$ is high, is conducted to the second input of the AND gate, and the output of the AND gate provides the $clk_{GF}$.

Another embodiment provides a method for providing glitch-free signal modulation over multiple RF bands, the method comprising providing a reconfigurable DLL circuit configured to receive a radio frequency input signal ($RF_{in}$) and a configuration signal; configuring the DLL to produce a DLL output ($DLL_{out}$) in one of a plurality of RF bands as a result the response of the reconfigurable delay-locked loop (DLL) circuit to the configuration signal; providing a frequency-agile, glitch-free multiplexer circuit configured to receive an oversampled baseband clock signal ($clk_{OBB}$), a phase select data input signal for providing phase select data; providing the multiplexer circuit with the $DLL_{out}$; and outputting a multiplexer output signal ($Mux_{out}$) based at least in part upon the phase select data and the $DLL_{out}$; wherein the multiplexer circuit comprises a first multiplexer and a second multiplexer, wherein each of the first multiplexer and the second multiplexer has inputs and at least one output, and wherein the phase select data includes at least a current phase select data and a next phase select data.

The method may further comprise providing the first multiplexer with the $DLL_{out}$ as a first input and the current phase select data as a second input; producing the $Mux_{out}$ as an output by modulating the $DLL_{out}$ with the current phase select data; providing the second multiplexer with the $DLL_{out}$ as a first input and the next phase select data as a second input; producing as an output a second multiplexer output ($OUT_{next}$) by modulating the $DLL_{out}$ with the next phase select data; providing a NOR gate having at least first and second inputs and at least an output; routing the $Mux_{out}$ through a branching path, with one branch conducting Mux$_{out}$ as output of the multiplexer circuit and another branch conducting Mux$_{out}$ to the first input of the NOR gate; conducting OUT$_{next}$ to the second input of the NOR gate; and using the output of the NOR gate in generating a glitch-free clock signal (clk$_{GF}$) for loading the next phase select data to the first multiplexer at a time such that glitches are avoided.

The method may further comprise providing an AND gate having at least first and second inputs and at least an output; routing the output of the NOR gate to the first input of the AND gate and a data change signal (data$_{change}$), which indicates that the phase select data has changed from one oversampled baseband period to the next when data$_{change}$ is high, to the second input of the AND gate; and using the output of the AND gate as the clk$_{GF}$. The method may further comprise providing a data holding circuitry for at least receiving clk$_{GF}$ and phase select data as inputs; and providing at least the current phase select data and the next phase select data as outputs to the first and second multiplexers, respectively, at least in part in response to clk$_{GF}$.

The notations [m:n] as used herein refers to the number indices of the bits in the various data paths and should be read as "bits n through m," with m being the higher bit.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications. Any permutations of the various aspects of the embodiments herein are considered to be within the scope of the embodiments disclosed herein and the embodiments disclosed herein include all such permutations.

BRIEF DESCRIPTION OF THE DRAWINGS

The embodiments herein will be better understood from the following detailed description with reference to the drawings, in which.

DETAILED DESCRIPTION OF THE INVENTION

Figure 1:
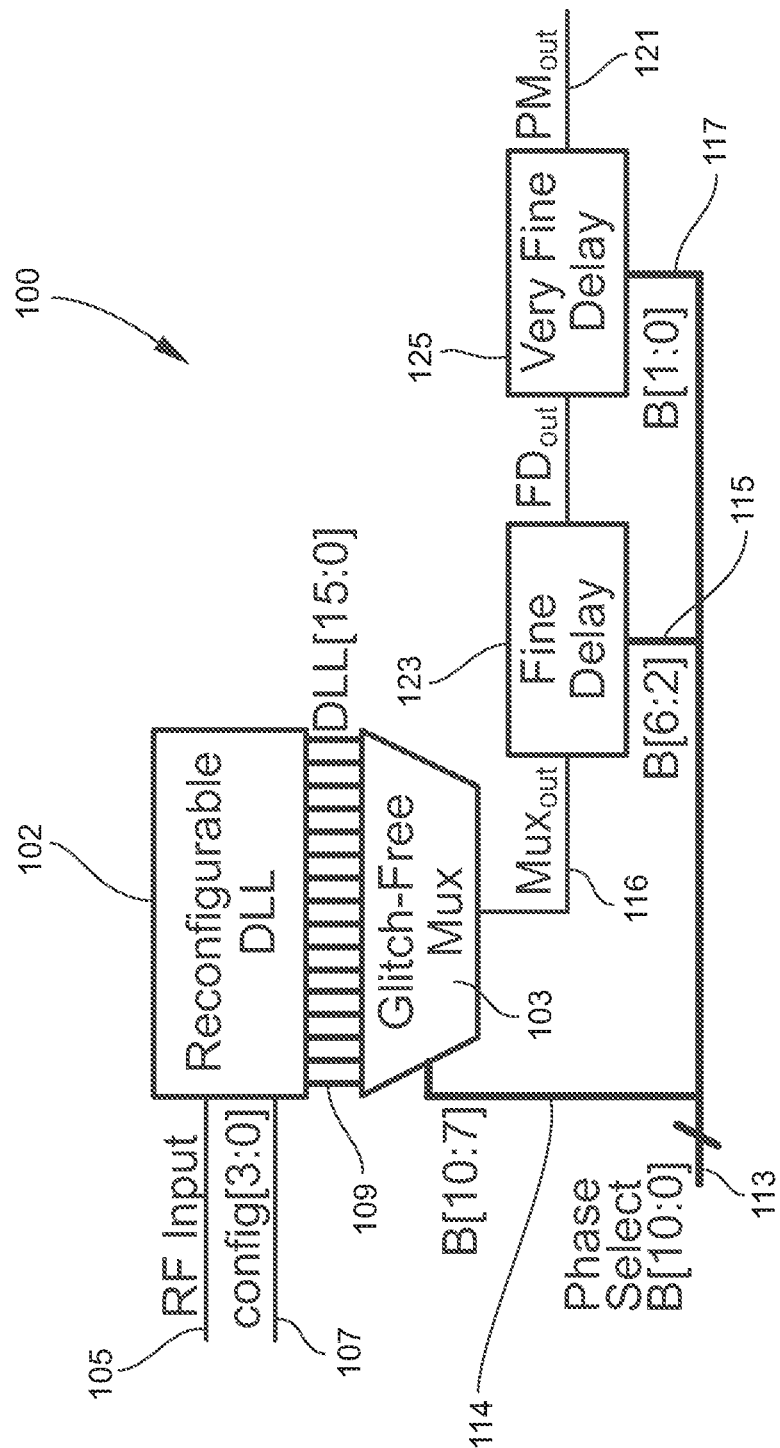
FIG. 1 is a block diagram illustrating a phase modulator circuit having a reconfigurable DLL circuit and a glitch-free multiplexer circuit, according to an embodiment herein.
Figure 2:
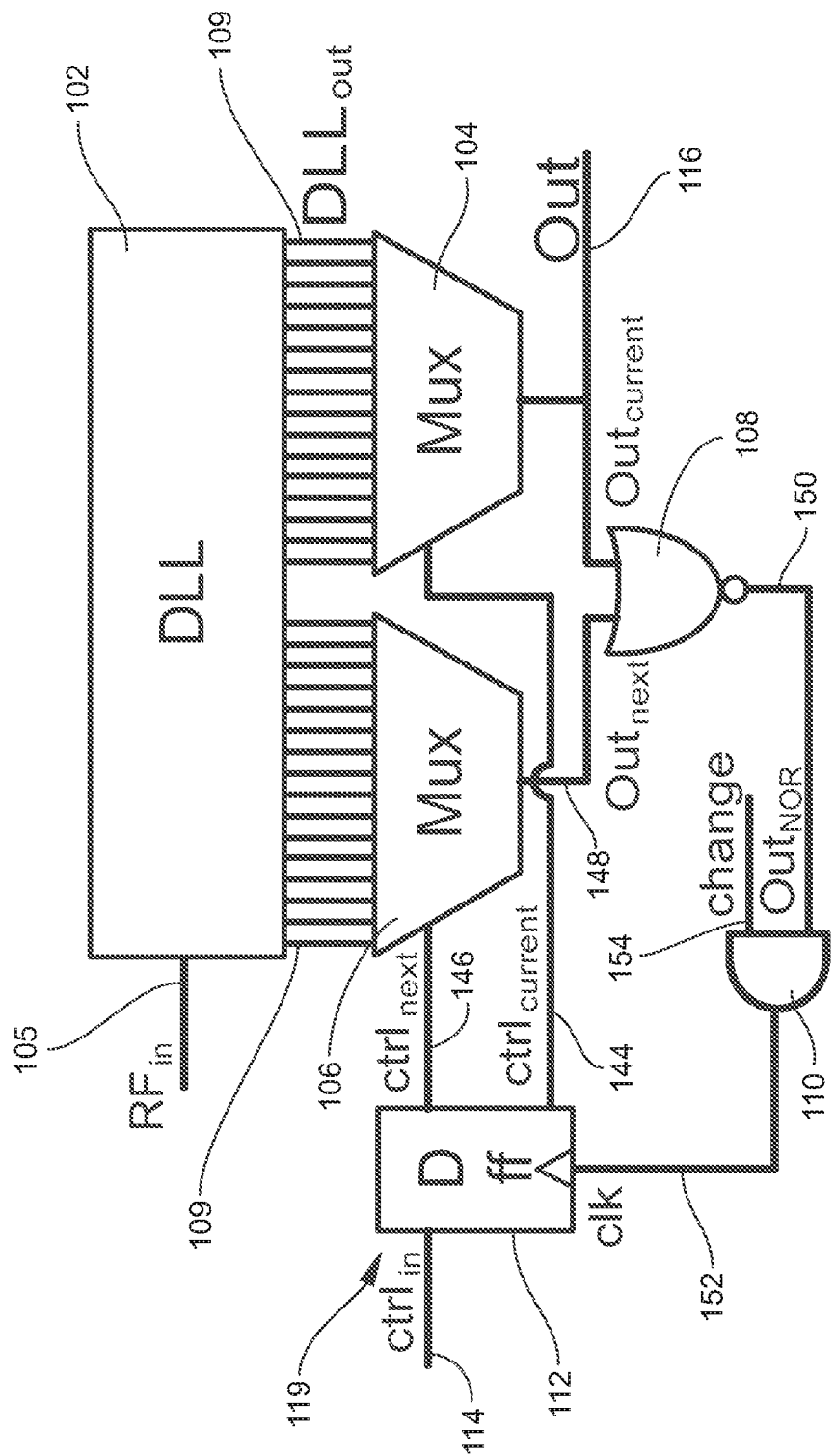
FIG. 2 is a block diagram illustrating a phase modulator circuit having a reconfigurable DLL circuit and a glitch-free multiplexer circuit shown in greater detail, according to an embodiment herein.

Embodiments of the disclosed invention, its various features and the advantageous details thereof, are explained more fully with reference to the non-limiting embodiments that are illustrated in the accompanying drawings and detailed in the following description. Descriptions of well-known components and processing techniques are omitted to not unnecessarily obscure what is being disclosed. Examples may be provided and when so provided are intended merely to facilitate an understanding of the ways in which the invention may be practiced and to further enable those of skill in the art to practice its various embodiments. Accordingly, examples should not be construed as limiting the scope of what is disclosed and otherwise claimed.

In the drawings, the size and relative sizes of layers, components, devices, and regions may be exaggerated for clarity. Moreover, the values given for some of the parameters described below and in the drawings are merely exemplary, and the embodiments herein are not restricted to these particular values. The embodiments herein provide a novel phase modulator architecture that, when combined with either a wideband power amplifier or multiple narrow-band amplifiers, allows for a single transmitter to transmit radar, communication, telemetry, or other similar waveforms across multiple frequency bands. The embodiments herein employ a reconfigurable delay-locked loop (DLL) circuit in conjunction with a frequency-agile, glitch-free multiplexer circuit. The embodiments herein eliminate the glitch phenomenon while providing for phase modulator operation over multiple frequency bands. The embodiments herein employ hybrid technologies that combine the advantages CMOS technologies and III-V semiconductors. Accordingly, the embodiments herein provide both the fast switching and processing speeds afforded by silicon-based CMOS technologies and the high gain and power output afforded by III-V semiconductor amplifiers, particularly gallium nitride (GaN) power amplifiers (PAs). Referring now to the drawings, and more particularly to FIGS. 1 through 19, where similar reference characters denote corresponding features consistently throughout, there are shown exemplary embodiments.

Referring to FIGS. 1 through 4, a frequency-agile phase modulator 100 with a glitch-free multiplexer is provided that comprises a reconfigurable delay-locked loop (DLL) circuit 102 and a frequency-agile, glitch-free multiplexer circuit 103. In one embodiment, the phase modulator circuit 100 includes a reconfigurable delay-locked loop (DLL) circuit 102 configured to receive a radio frequency (RF) input signal 105 ($RF_{in}$) and a configuration signal 107. The DLL circuit 102 is configured to produce a DLL output signal 109 ($DLL_{out}$) over a plurality of RF bands. The phase modulator circuit 100 also includes a frequency-agile, glitch-free multiplexer circuit 103 configured to receive an oversampled baseband clock signal 111 ($clk_{OBB}$) and a phase select data input signal 114 to the multiplexer circuit for providing phase select data, which is constituted by the coarse phase select data, to the multiplexer circuit 103. In the illustrated example, the phase select data input signal 114 to the multiplexer circuit comprises a portion of the complete bit string or bit set constituting the complete phase select data at any given time. In the illustrated example, the phase select data input signal 114 to the multiplexer circuit corresponds to the most significant four bits; i.e., bits 7 through 10 corresponding in turn to the coarse phase select data, of the complete phase select data signal 113. The complete phase select data signal or the complete phase select data 113 includes bits coding for the fine phase select data 115 (B[6:2]) and the very-fine phase select data 117 (B[1:0]) in addition to the coarse phase select data 114 (B[10:7]). The multiplexer circuit is configured to receive the $DLL_{out}$ 109 and to output a multiplexer output signal 116 ($Mux_{out}$) based at least in part upon the phase select data and the $DLL_{out}$. The DLL circuit 102 comprises a delay-line 118 comprising a plurality of inverters 120. Each of the inverters 120 has at least an input and an output.

In the illustrated example, the DLL circuit 102 further includes a frequency-select multiplexer 122 ($Mux_{FSel}$) that is configured to receive the configuration signal 107. The $Mux_{FSel}$ 122 has a plurality of electrical connections 124 to the delay line and a $Mux_{FSel}$ output line 126 that serves as a delay-line output. Each of the plurality of electrical connections to the delay line is to the output of a corresponding one of the plurality of inverters 120. The delay line has a configurable effective delay line length, wherein the configuration signal 107 configures the $Mux_{FSel}$ 122 to adjust the effective length of the delay line 118 by selecting the output of one of the inverters 120 that have their outputs connected to the $Mux_{FSel}$ 122 to serve as the delay-line output 126 in the DLL circuit 102.

In the illustrated example, the $Mux_{FSel}$ 122 has a plurality of inputs, each of which is connected by a respective one of the plurality of the electrical connections 124 to the delay line 118. In the illustrated example, the delay line 118 in the DLL circuit 102 comprises thirty two inverters 120. The $Mux_{FSel}$ 122 has at least one input connected to the output of the eighth inverter 120, at least one input connected to the output of the twelfth inverter 120, at least one input connected to the output of the sixteenth inverter 120, at least one input connected to the output of the twentieth inverter 120, at least one input connected to the output of the twenty fourth inverter 120, at least one input connected to the output of the twenty eighth inverter 120, and at least one input connected to the output of the thirty second inverter 120. In the illustrated example, there are four inverters 120 between each pair of consecutive electrical connections in the plurality of electrical connections 124 from the delay line 118 to the $Mux_{FSel}$ 122.

In one embodiment, the DLL circuit 102 further comprises a current-mode logic (CML) divide-by-2 element 128 that receives the RF input signal 105 ($RF_{in}$) as input and provides a low phase noise RF signal 130 at one half the frequency of the RF input signal ($RF_{in}$). The output of the CML divide-by-2 element 128 is also the delay-line input 130. This low phase noise RF signal 130 serves as input to the delay line and as a reference signal to a first inverter 132 outside the delay line 118. The output of the first inverter 132 outside the delay line is electrically connected to one input of a phase detector 136 via a replica multiplexer 134 ($Mux_{rep}$). The delay-line output 126 is electrically connected to another input of the phase detector 136. The $Mux_{rep}$ 134 provides a delay in the reference signal 135, which is the output of the $Mux_{rep}$ 134, to match the delay due to the $Mux_{FSel}$ 122 in the delay-line output 126.

In the illustrated example, the DLL circuit 102 further comprises a charge pump 138 and a loop filter 140. The charge pump 138 has inputs and outputs, and the loop filter 140 also has inputs and outputs. The outputs of the phase detector 136 are electrically connected to the inputs of the charge pump 138, and the outputs of the charge pump 138 are electrically connected to the inputs of the loop filter 140. The outputs of the loop filter 140 are electrically connected to the bias voltage of each of the inverters 120 in the delay line 118.

In the illustrated example, the $DLL_{out}$ 109 comprises a plurality of signal paths. The output of every other inverter 120 in the delay line 118, beginning with the first inverter 120 in the delay line 118 and ending with the next to the last invertor 120 in the delay line 118, is electrically connected to a respective one of the plurality of signal paths in the $DLL_{out}$ 109 via a corresponding inverter 142 outside the delay line 118.

In the illustrated example, the multiplexer circuit 103 comprises a first multiplexer 104 and a second multiplexer 106. Each of the first multiplexer 104 and the second multiplexer 106 has inputs and at least one output. The phase select data 114 includes at least a current phase select data and a next phase select data. The first multiplexer receives the $DLL_{out}$ 109 as a first input and the current phase select data 144 as a second input and produces the $Mux_{out}$ 116 as an output. The current phase select data 144 modulates the $DLL_{out}$ 109 to produce the $Mux_{out}$ 116. The second multiplexer 106 receives the $DLL_{out}$ 109 as a first input and the next phase select data 146 as a second input and produces as an output a second multiplexer output 148 ($OUT_{next}$). The next phase select data 146 modulates the $DLL_{out}$ 109 to produce the $OUT_{next}$ signal 148.

In the illustrated example, the multiplexer circuit also includes a NOR gate 108 that has at least first and second inputs and at least an output. The $Mux_{out}$ 116 is routed through a branching path, with one branch conducting $Mux_{out}$ as output of the multiplexer circuit 103 and another branch conducting $Mux_{out}$ 116 to the first input of the NOR gate 108. The $OUT_{next}$ 148 is conducted to the second input of the NOR gate 108 and the output 150 of the NOR gate 108 is used in generating a glitch-free clock signal 152 ($clk_{GF}$) for loading the next phase select data 146 to the first multiplexer 104 at a time such that glitches are avoided. The loading of the next phase select data 146 to the first multiplexer 104 is effectuated via the same conductive path for loading the current phase select data 144 to the first multiplexer 104. The loading of the next phase select data 146 to the first multiplexer 104 results from the next phase select data 146 taking the place of the current phase select data 144 in the data holding circuitry 119, essentially becoming the current phase select data 144, in response to the $clk_{GF}$ 152. This means that the current phase select data 144 is consequently set to the next phase select data 146. In other words, the next phase select data 146 becomes the current phase select data 144 for the subsequent operations of the phase modulator circuit 100.

In the illustrated example, the multiplexer circuit 103 also includes an AND gate 110 having at least first and second inputs and at least an output. The output 150 of the NOR gate 108 is routed to the first input of the AND gate 110 and a data change signal 154 ($data_{change}$), which indicates that the phase select data has changed from one oversampled baseband period to the next (in other words that there has been a change in the next phase select data 146 and the current phase select data 144) when $data_{change}$ 154 is high, is conducted to the second input of the AND gate 110. The output of the AND gate 110 provides the $clk_{GF}$ 152.

In the illustrated example, the multiplexer circuit 103 also includes data holding circuitry 119 at least receiving $clk_{GF}$ 152 and phase select data 144 and 146 as inputs and providing at least the current phase select data 144 and the next phase select data 146 as outputs to the first and second multiplexers 104 and 106, respectively, at least in part in response to $clk_{GF}$ 152. In the illustrated example, the data holding circuitry 119 comprises at least one flip-flop 112. More preferably, the data holding circuitry 119 includes a plurality of flip-flops as in the illustrated example of FIG. 4.

Figure 4:
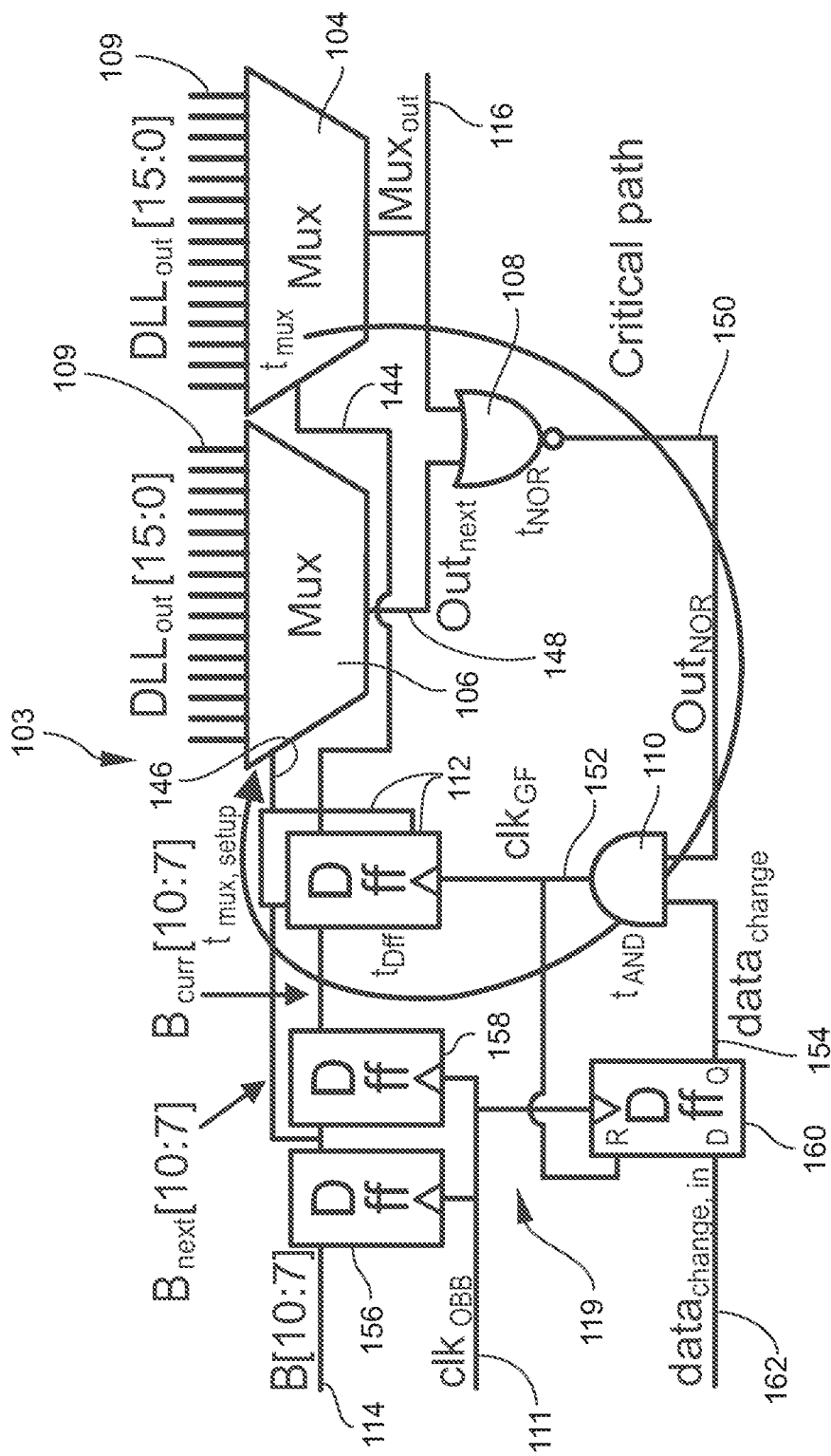
FIG. 4 is a schematic circuit diagram illustrating a glitch-free multiplexer circuit of the modulator circuit of FIG. 2, according to an embodiment herein.

Referring to FIG. 4, an embodiment herein includes a data holding circuitry 119 that includes at least two flip-flops 112, one flip-flop 112 for holding the current phase select data 144 and one flip-flop 112 for holding the next phase select data 146. The data holding circuitry 119 of FIG. 4 also includes a second pair of flip-flops 156 and 158 that also hold the current phase select data 144 and the next phase select data 146, respectively. The data holding circuitry 119 of FIG. 4 also includes a fifth flip-flop 160 for receiving the data change input signal 162 ($data_{change,in}$). The flip-flop 160 operates to set the $data_{change}$ 154 to high if the data change input signal 162 indicate a change in the phase select data from one oversampled baseband period to the next.

The phase select data 114 (B[10:7]) is supplied as one input to the flip-flop 156. The flip-flop 156 communicates with the flip-flop 158 and the flip-flop 112 for the next phase select data 146. The flip-flop 158 communicates with the flip-flop 112 for the current phase select data 144. The flip-flops 156, 158, and 160 receive the $clk_{OBB}$ 111 as one input. Both flip-flops 112 and the flip-flop 160 receive the $clk_{GF}$ 152.

In operation, each clock pulse of $clk_{OBB}$ 111 causes the flip-flop 156 to receive and store a new phase select data 114 as a new next phase select data 146 and to communicate the next phase select data 146 previously stored in the flip-flop 156 to the flip-flop 158, causes the flip-flop 158 to receive from the flip-flop 156 and store the next phase select data 146 as the current phase select data 144, and causes the flip-flop 160 to receive a new $data_{change,in}$ 162 and set $data_{change}$ 154 in accordance with the new $data_{change,in}$ 162. Each time the $clk_{GF}$ 152 goes high, one flip-flop 112 receives and outputs the current phase select data 144 to the first multiplexer 104, and the other flip-flop 112 receives and outputs the next phase select data 146 to the second multiplexer 106. Also, the flip-flop 160 clears or resets the $data_{change}$ 154 to low when the $clk_{GF}$ 152 goes high to make the $data_{change}$ 154 ready for the next cycle. The $clk_{GF}$ 152 goes high only when the outputs of both multiplexers 104 and 106 are low and there is a change in the phase select data from one $clk_{OBB}$ 111 pulse to the next or from the current phase select data 144 to the next phase select data 146. This arrangement ensures that new phase select data is loaded to the multiplexers 104 and 106 only when the outputs of both multiplexers 104 and 106 (the $Mux_{out}$ 116 and the $OUT_{next}$ signal 148) are low, thus providing for glitch-free operation of the multiplexer circuit 103 and the demodulator circuit 100.

The $RF_{in}$ 105 may be provided by a local oscillator (LO). The configuration signal 107 may be provided by, for example, a controller (not shown) that may also control the local oscillator. The phase select data may, for example, be generated from the incoming data bit stream through a coordinate rotation digital computer (CORDIC) (not shown) or other phase generation block. The $data_{change,in}$ 162 signal can be generated off chip using a field programmable gate array (FPGA) (not shown) or on-chip using digital logic.

Figure 5:
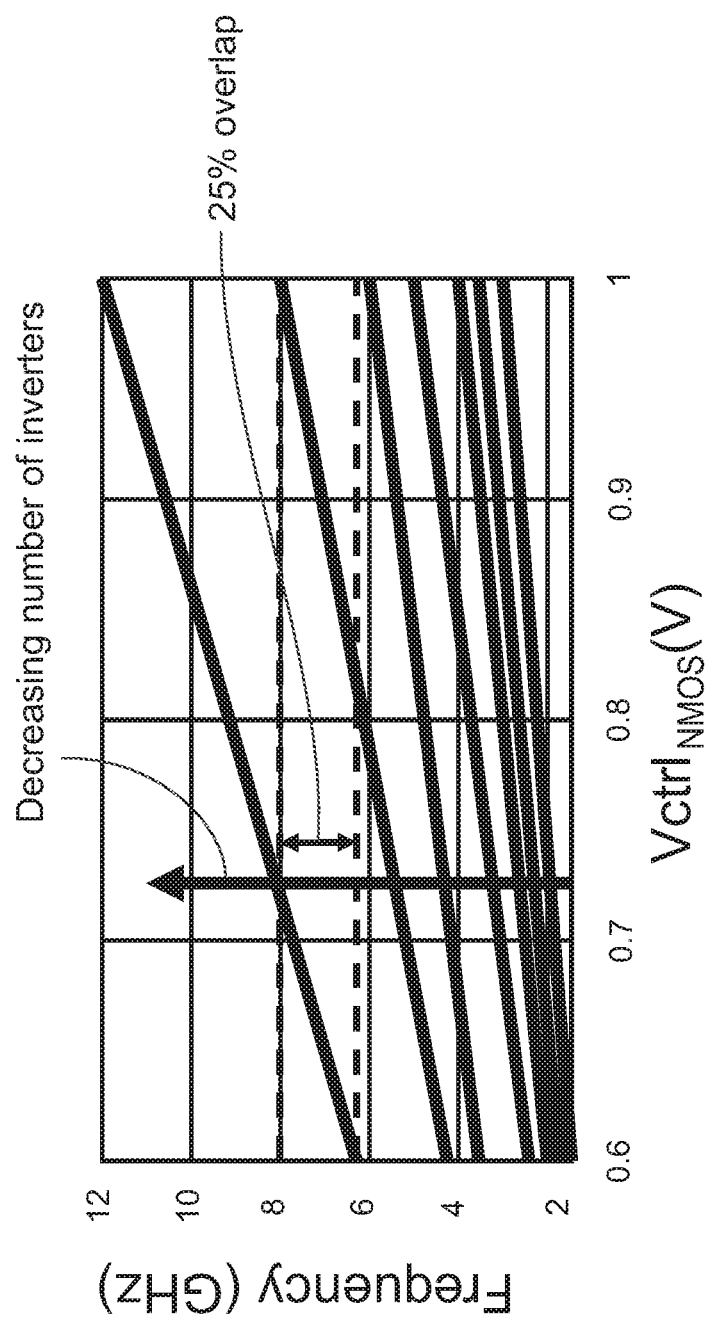
FIG. 5 is a graph showing the frequency range of the reconfigurable DLL, according to an embodiment herein.
Figure 6:
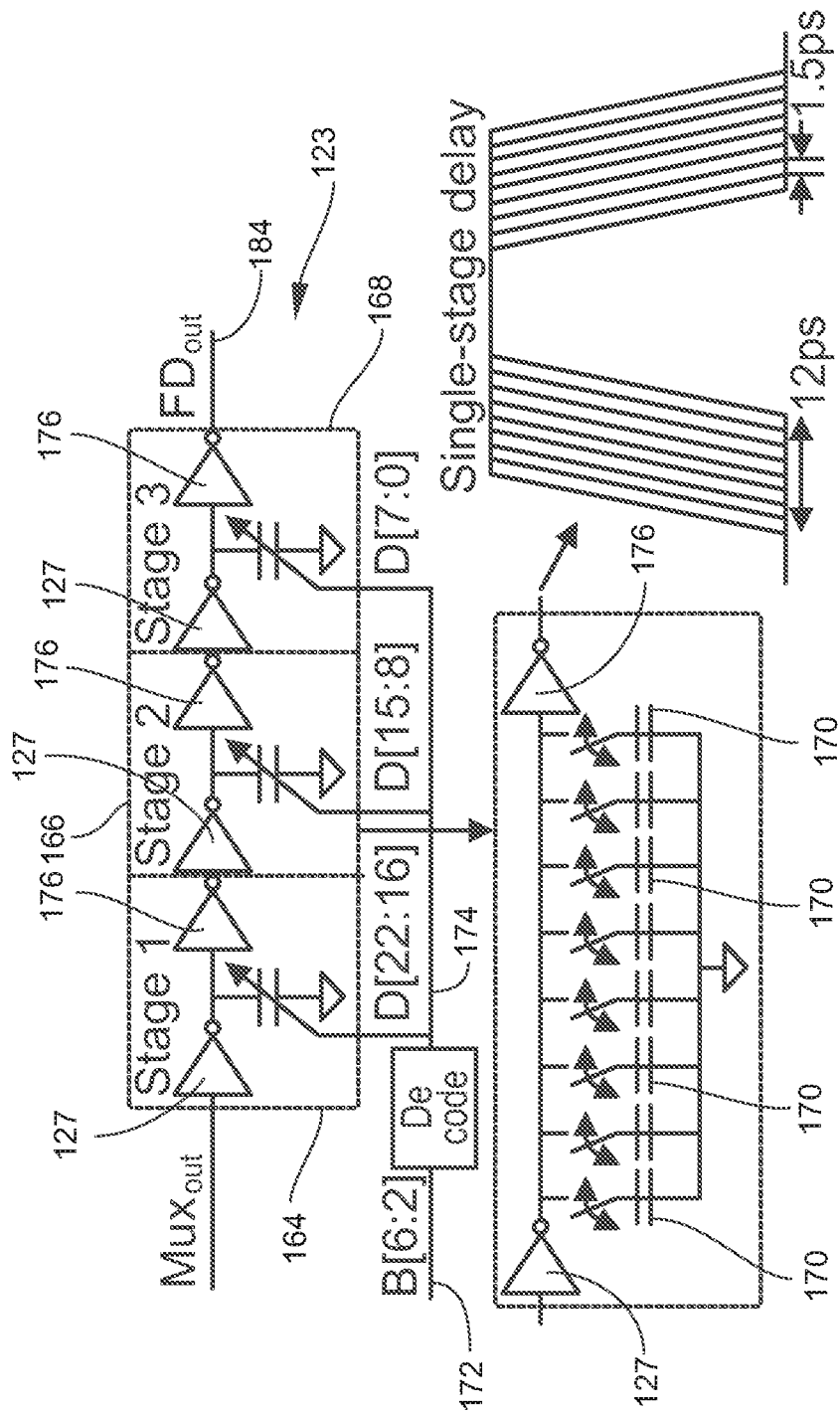
FIG. 6 is a schematic circuit diagram illustrating a fine delay circuit of the modulator circuit of FIG. 1, according to an embodiment herein.

In one embodiment, a 10-bit resolution was chosen for the phase select data 113, and thus for the phase modulator circuit 100. Referring to FIGS. 1, 5, and 6, the phase modulator circuit 100 may also include a fine delay block 123 and a very-fine delay block 125. This phase resolution is achieved using a segmented approach with three stages: a reconfigurable delay-locked loop circuit 102 (also referred to herein as the DLL circuit or DLL for brevity) and glitch-free multiplexer circuit 103 (mux) for 4-bit coarse resolution, a 4-bit fine delay block 123 (with an additional bit to increase the fine delay span) implemented with capacitively loaded inverters 127, and a 2-bit very-fine delay block 125 implemented with two inverter stages 178 and 180. At higher frequencies the reconfigurable DLL provides less than 4-bit phase resolution, resulting in the decreased resolution in the middle and high frequency ranges.

The 11 phase select bits B[10:0] are used to control the modulation of the RF input signal 105. Note that 11 phase select bits are needed even though only a maximum of 10-bit resolution is achieved. The 11th bit is used to increase the span of the fine delay to compensate for gaps in phase coverage caused by frequency tuning and process corners.

These bits are received over an LVDS data channel (see FIG. 12) and dynamically change at the oversampled baseband data rate (corresponding to $clk_{OBB}$ 111), which is up 400 MHz. SPI (serial peripheral interface) 310 registers are used to provide static configuration data to the DLL circuit 102 to reconfigure it based on the desired RF operating frequency.

Figure 3:
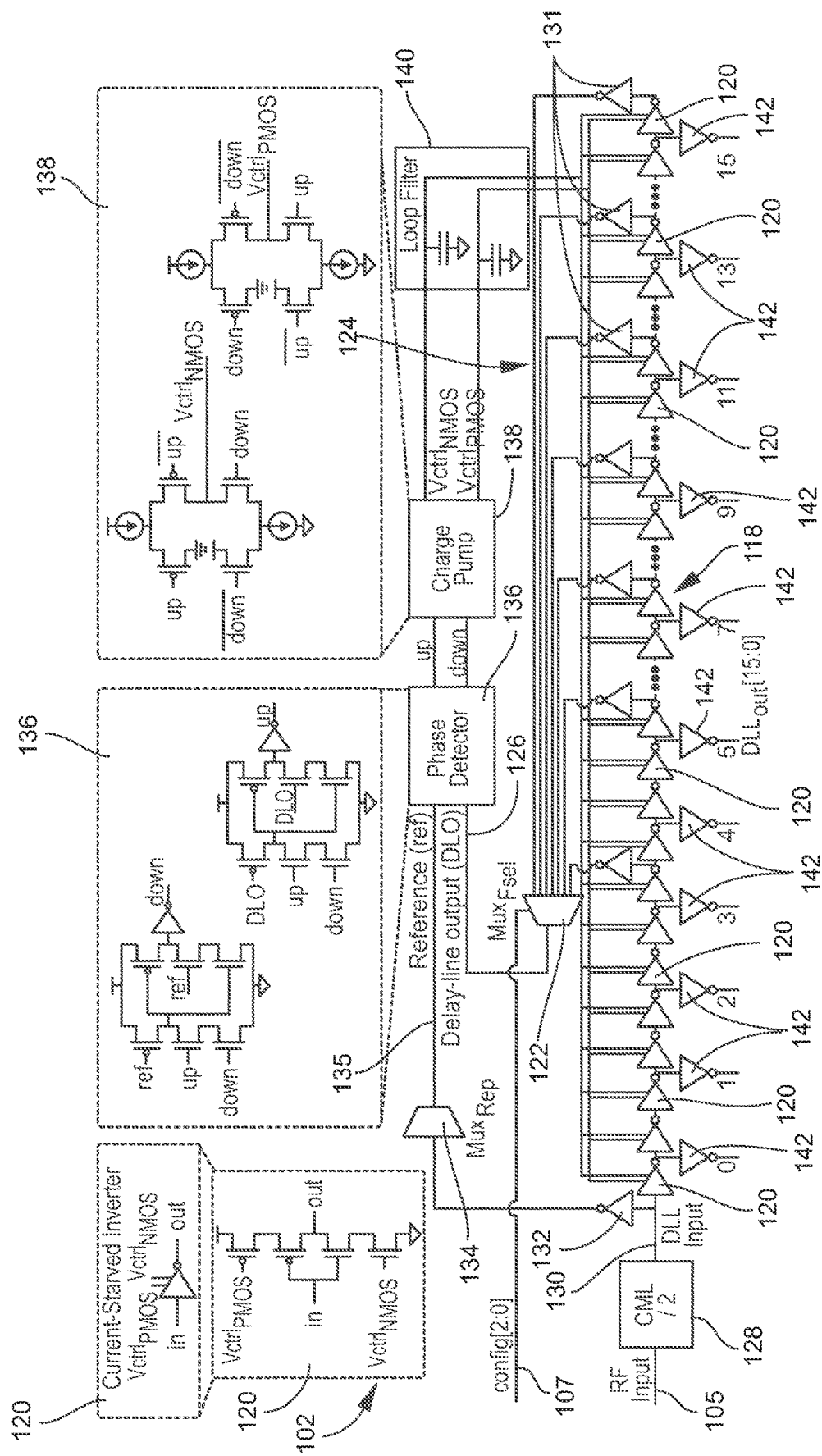
FIG. 3 is a schematic circuit diagram illustrating a reconfigurable DLL circuit of the modulator circuit of FIG. 2, according to an embodiment herein.

FIG. 3 shows the block diagram of the reconfigurable DLL used for 4-bit coarse delay. The primary function of the DLL circuit 102, at times referred to herein as the DLL for the sake of brevity, is to match the time delay of the selectable-length inverter chain 118 to one RF clock period. The RF input signal 105 is externally supplied at twice the desired RF carrier frequency, then a current-mode logic (CML) divide-by-two circuit 128 is implemented to provide the DLL 102 with a 50% duty cycle low phase-noise input signal at the desired RF frequency. The output of the CML divide-by-two 128 is the DLL delay-line 118 input signal, which is fed to a delay-line 118 including 32 current-starved inverters 120. The current-starved inverters 120 are formed by an inverter which has analog-biased NMOS and PMOS devices that control the amount of switching current available, to thereby increase or decrease the amount of delay for each inverter 120. Each current-starved inverter 120 drives the subsequent current-starved inverter 120. Some of the current-starved inverters 120 additionally drive a separate branch inverter 131 that is used for DLL locking or one of the branch inverters 142 used for $DLL_{out}$ signals.

To enable DLL locking, a true single-phase clock (TSPC) D flip-flop base phase detector 136 encodes the phase difference between the reference 135 and delay-line output 126 in the widths of the "up" and "down" pulses. The fully-differential charge pump 138 and loop filter 140 adjust the current-starved inverter 120 biases, $Vctrl_{NMOS}$ and $Vctrl_{PMOS}$, changing the total delay of the delay-line 118 to align the rising edge of the reference signal 135 with that of the delay-line output signal 126. Simulations show each current-starved inverter 120 has a delay range of 10.5-19.6 ps, requiring the number of current-starved inverters 120 in the delay line to be adjusted to ensure there is only one RF period of delay in the delay line 118. The configuration signal 107 (corresponding to the four-bit config[3:0] signal or the three-bit config[2:0] signal) statically configures the frequency-select mux 122 ($Mux_{FSel}$) to adjust the length of the delay line 118 by selecting the output of the 8th, 12th, 16th, 20th, 24th, 28th, or 32nd current-inverter 120 to serve as the delay-line output 126 that the DLL is locked to. This delay-line length selection results in the operating frequency ranges shown in FIG. 5. The frequency ranges were designed to have a minimum of 25% overlap to ensure continuous frequency coverage in the presence of device mismatch and process corners which can increase or decrease the delay of each current-starved inverter 120.

The reconfiguration of the DLL 102 for multiple frequency bands via the frequency select mux 122 ($Mux_{FSel}$) results in extra delay in the delay-line output 126. This creates a delay mismatch between the reference signal 135 and the delay-line output signal 126, which results in significant phase error in the $DLL_{out}$ signals 109. To minimize this delay mismatch, a replica mux 134, $Mux_{Rep}$, is placed in the path of the reference signal 135 to match the delay of $Mux_{FSel}$ 122. Without $Mux_{Rep}$ 134, there is a 45 ps delay mismatch between the reference 135 and the delay-line output 126. To demonstrate the necessity of this delay-matching, consider the DLL 102 operating with a 200 ps period (5 GHz) delay-line input signal 130. At this frequency, the DLL 102 is locked to the output of the 16th current-starved inverter 120, allowing 3-bit coarse resolution generated on $DLL_{out}$[7:0]. The 45 ps delay mismatch causes the delay line 118 to produce 155 ps delay instead of the desired 200 ps delay, resulting in only 279° of phase coverage being provided and producing a 5°+n×10.1° phase error on $DLL_{out}$[7:0], where n is the bit-index of the $DLL_{out}$ signal. With $Mux_{Rep}$ 134 and matching the routing length of the signals, there is less than a 0.5 ps delay-mismatch between the reference 135 and delay-line output 126 paths, resulting in a maximum phase error of 0.5° and degrading the adjacent-channel leakage ratio (ACLR) by only 0.1 dBc.

For a glitch-free multiplexer 103 to work across a wide frequency range, it is imperative to use an architecture that doesn't rely on time delays for glitch-free operation. The implemented glitch-free mux architecture, shown in FIG. 4, uses a pipelined data path to allow both the current and future phase select data ($B_{curr}$[10:7] and $B_{next}$[10:7], respectively) to be simultaneously available, allowing the mux to determine if the glitch-free transition condition is met before it makes the transition. Two independent muxes 104 and 106 are implemented; one receiving the phase select data from $B_{curr}$[10:7] 144 and producing the $Mux_{out}$ signal 116, and the other receiving the phase select data from $B_{next}$[10:7] 146 and producing the $Out_{next}$ signal 148. $Mux_{out}$ and $Out_{next}$ undergo a logical NOR operation at NOR gate 108, producing a signal on $Out_{NOR}$ that goes high (logical "1") when both $Mux_{out}$ and $Out_{next}$ are low, indicating that a glitch-free transition can be made.

While $Out_{NOR}$ could be directly used to clock in the new phase select data for both muxes, this signal transitions at the RF frequency (2.2-10.4 GHz) even though the phase select data 114 (B[10:7]) only changes at the oversampled baseband clock 111 ($clk_{OBB}$) frequency (400 MHz). It is therefore desirable to decrease the frequency of the glitch-free clock to the oversampled baseband rate to lower the dynamic power consumption of the circuit while still maintaining glitch-free operation. To achieve this, a $data_{change}$ signal 154 is generated that goes high when $B_{curr}$[10:7] 144 and $B_{next}$[10:7] 146 change, which only occurs when B[10:7] 114 is different from one oversampled baseband period to the next. $Out_{NOR}$ 150 and this $data_{change}$ signal 154 are combined by a logical AND gate 110, producing the glitch-free clock signal 152 ($clk_{GF}$) which clocks in the new phase select data. The $clk_{GF}$ 152 transitioning high also resets $data_{change}$ 154 so it can transition high the next time the incoming phase select data 114 changes. Since B[10:7] are the most significant bits of the phase select signal 113, they don't typically change every cycle. This results in $data_{change}$, and therefore $clk_{GF}$, transitioning at even less than the $clk_{OBB}$ frequency, further decreasing the dynamic power dissipation of the glitch-free multiplexer circuit 103. In one example, the modulator circuit 100 provides a maximum phase transition of 147° at 2.2 GHz and 62° at 8 GHz.

The modulator circuit 100 may additionally include a fine delay circuit 123 and a very-fine delay circuit 125. FIGS. 1 and 6 show the 4-bit fine delay circuit 123, which is implemented using three stages 164, 166, and 168 of capacitively loaded inverters 127, with an additional bit implemented to increase the fine delay span. The fine delay circuit 123 receives the $Mux_{out}$ 116 as one input and produces a fine-delay output signal 184 ($FD_{out}$). Each of the stages 164, 166, and 168 includes an inverter 127 with 8 unary sized capacitors 170 that can be switched onto its output. The 5-bit dynamic fine phase select data 172 (B[6:2]) is decoded to produce the signal 174 (D[22:0]) which switches in or out the capacitive loads 170. The capacitors 170 are sized so that each produce a 1.5 ps delay, and the decoded control signal 174 (D[22:0]) produces 1.5 ps, 3 ps, 6 ps, 12 ps, and an additional 12 ps delays. This additional delay is needed to increase the delay line span by 50% to provide adequate delay for low frequency operation. For example, at 2.2 GHz the coarse delay produces outputs that are spaced by 28 ps. Without the extra 12 ps delay the fine delay only covers 22.5 ps delay, leaving a 5.5 ps gap in phase coverage. The extra delay increases the fine delay span to 34.5 ps, ensuring that full phase coverage is achieved.

Each capacitively loaded inverter 127 is followed by a non-loaded inverter 176 to restore the edge rate of the signal and improve the linearity of the fine delay step. Careful consideration is placed on the layout of the capacitors 170 to improve the monotonicity of the delay step. The 45 nm CMOS process technology only features vertical natural capacitors, which have larger capacitance variation than more controlled capacitors such as MIM capacitors. To improve the capacitor matching, they are laid out in an array with dummy capacitors placed around their periphery, and they are placed on the metal layers that have the lowest variation. A Monte Carlo simulation across process and mismatch shows a 3σ delay variation increase of 130 fs due to the vertical natural capacitor variation.

Figure 7:
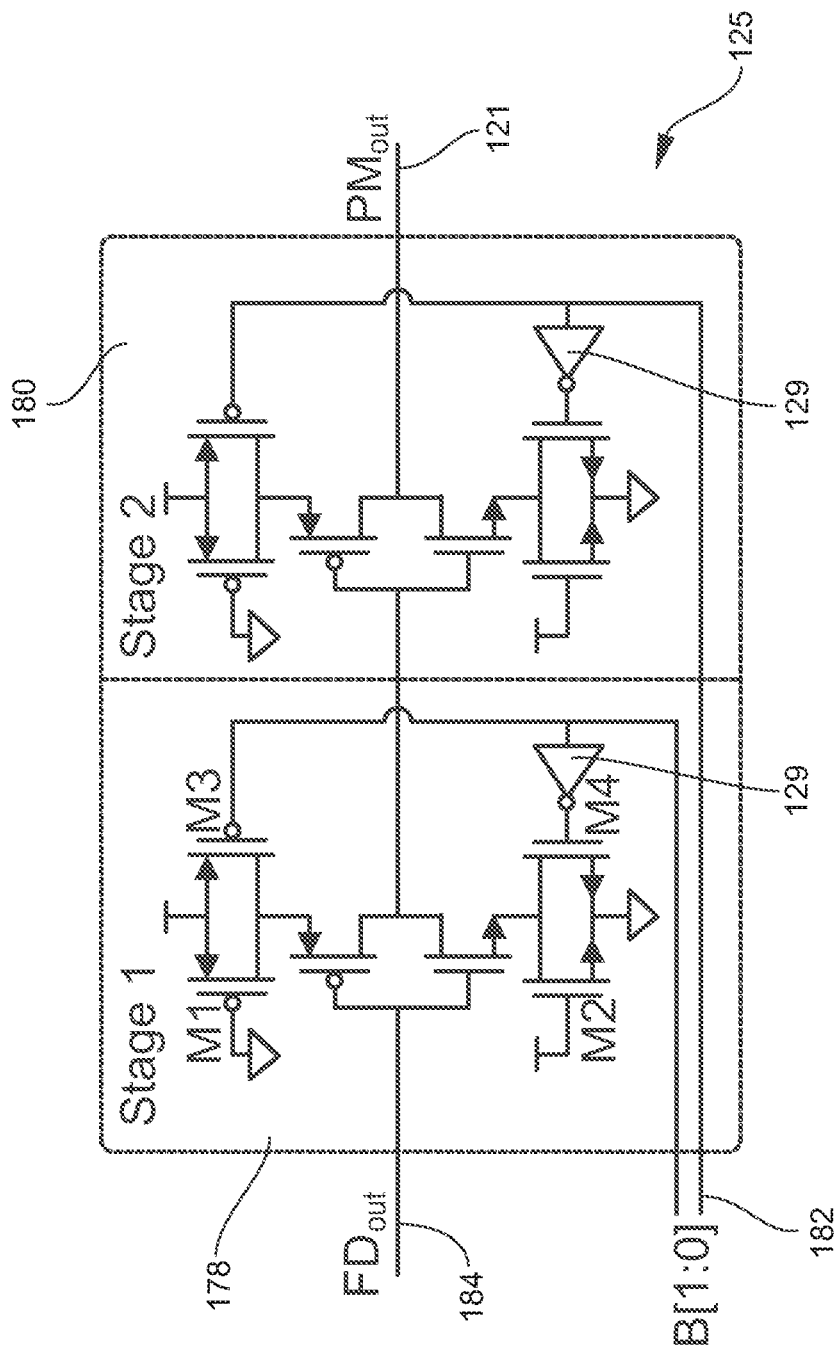
FIG. 7 is a schematic circuit diagram illustrating a very fine delay circuit of the modulator circuit of FIG. 1, according to an embodiment herein.

The 2-bit very-fine delay block 125 is implemented using two stages 178 and 180 of current-starved inverters as shown in FIG. 7. The very-fine delay circuit 125 receives the $FD_{out}$ 184 as one input and produces an output signal corresponding to the phase modulator output 121 ($PM_{out}$). Both stages 178 and 180 are identical except the transistors M1, M2, M3, and M4 are sized differently in each stage in order to produce the 750 fs and 375 fs delays needed to achieve 8-bit resolution at 10.4 GHz. Each of the stages 178 and 180 includes four transistors M1, M2, M3, and M4 and two regular inverters 129. Transistors M1 and M2 are always on to supply switching current to the inverter stages 178 and 180. To modulate the delay, very fine phase select data 182 (B[1:0]) turns transistors M3 and M4 on or off to increase or decrease the amount of current available for the main inverter switching. Because the delay depends on the sizing of the transistors, these stages are susceptible to delay variation due to sizing mismatch and process corners. Monte Carlo simulations across process and mismatch show a 3σ delay variation increase of 93 fs and 64 fs for the first and second very-fine delay stages, respectively.

Referring to FIG. 3, the details of the structures of the phase detector circuit 136 and the charge pump circuit 138 are shown using standard circuit component symbols that are well understood by those of ordinary skill in the art. Detailed discussions of the structure and function of these circuits are not presented herein because such details are shown in the prior art publication W. H. Lee, J. D. Cho, and S. D. Lee, "A high speed and low power phase-frequency detector and charge-pump," Proc. Asia South Pacific Des. Autom. Conf., vol. 1, pp. 269-272, January 1999, which is incorporated by reference herein in its entirety. Details of the structure and function of the current starved inverters are shown in FIG. 3 and have already been discussed above.

The diagrammatic representations in the drawing figures depict some conductive pathways with single lines. It should be understood that for signals containing multiple bits, the corresponding conductive pathways may comprises multiple parallel conductors or a single conductor carrying data serially. Several components discussed herein are discussed in great detail in the PhD dissertation "A Fully-Integrated Four-way Outphasing Architecture in Heterogeneously Integrated CMOS/GaN Process Technologies," by Matthew LaRue, Ohio State University, 2018, which is incorporated by reference herein in its entirety.

Referring to FIGS. 8 through 15, the embodiments herein include transmitter circuits 200 and 300, for transmitting radio frequency signals, that employ phase modulators, such as for example the phase modulator 100, that include a reconfigurable delay-locked loop (DLL) circuit 102 and a frequency-agile, glitch-free multiplexer circuit 103. The reconfigurable delay-locked loop (DLL) circuit 102 is configured to receive a radio frequency (RF) input signal 105 ($RF_{in}$) and a configuration signal 107. The DLL circuit 102 is configured to produce a DLL output 109 ($DLL_{out}$) over a plurality of RF bands.

The frequency-agile, glitch-free multiplexer circuit 103 is configured to receive an oversampled baseband clock signal 111 ($clk_{OBB}$) and a phase select data input signal 114 for providing phase select data. The multiplexer circuit 103 is also configured to receive the $DLL_{out}$ 109 and to output a multiplexer output signal 116 ($Mux_{out}$) based at least in part upon the phase select data 114 and the $DLL_{out}$ 109. The transmitters 200, 300 also include at least one power amplifier 202 and 302 that has at least an input and an output. The input to the power amplifier is based at least in part on the $Mux_{out}$.

The transmitter circuits 200, 300 also include at least one buffer circuit 204, 304 for processing a signal based at least on $Mux_{out}$ to provide a buffer circuit output signal that is suitable as an input signal to the power amplifier 202 or 302.

As previously described, the multiplexer circuit comprises a first multiplexer 104, a second multiplexer 106, and a NOR gate 108. Each of the first multiplexer 104 and the second multiplexer 106 has inputs and at least one output. The phase select data 114 includes at least a current phase select data 144 and a next phase select data 146. The first multiplexer 104 receives the $DLL_{out}$ 109 as a first input and the current phase select data 144 as a second input and produces the $Mux_{out}$ 116 as an output. The current phase select data 144 modulates the $DLL_{out}$ 109 to produce the $Mux_{out}$ 116.

The second multiplexer 106 receives the $DLL_{out}$ 109 as a first input and the next phase select data 146 as a second input and produces as an output a second multiplexer output 148 ($OUT_{next}$). The next phase select data 146 modulates the $DLL_{out}$ 109 to produce the $OUT_{next}$ 148.

The NOR gate 108 has at least first and second inputs and at least an output. The $Mux_{out}$ 116 is routed through a branching path, with one branch conducting $Mux_{out}$ 116 as output of the multiplexer circuit 103 and another branch conducting $Mux_{out}$ 116 to the first input of the NOR gate 108. The $OUT_{next}$ 148 is conducted to the second input of the NOR gate 108 and the output of the NOR gate 108 is used in generating a glitch-free clock signal 152 ($clk_{GF}$) for loading the next phase select data 146 to the first multiplexer 104 as the new current phase select data 144 at a time such that glitches are avoided.

The multiplexer circuit 103, as used in transmitter circuits 200, and 300, further comprises an AND gate 110 that has at least first and second inputs and at least an output. The output of the NOR gate 108 is routed to the first input of the AND gate 110 and a data change signal 154 ($data_{change}$), which indicates that the phase select data has changed from one oversampled baseband period to the next when $data_{change}$ is high, is conducted to the second input of the AND gate 110. The output of the AND gate 110 provides the $clk_{GF}$ 152. In all respects, the modulator circuits 100, as used with example transmitters 200 and 300, are the same as previously described.

Figure 8:
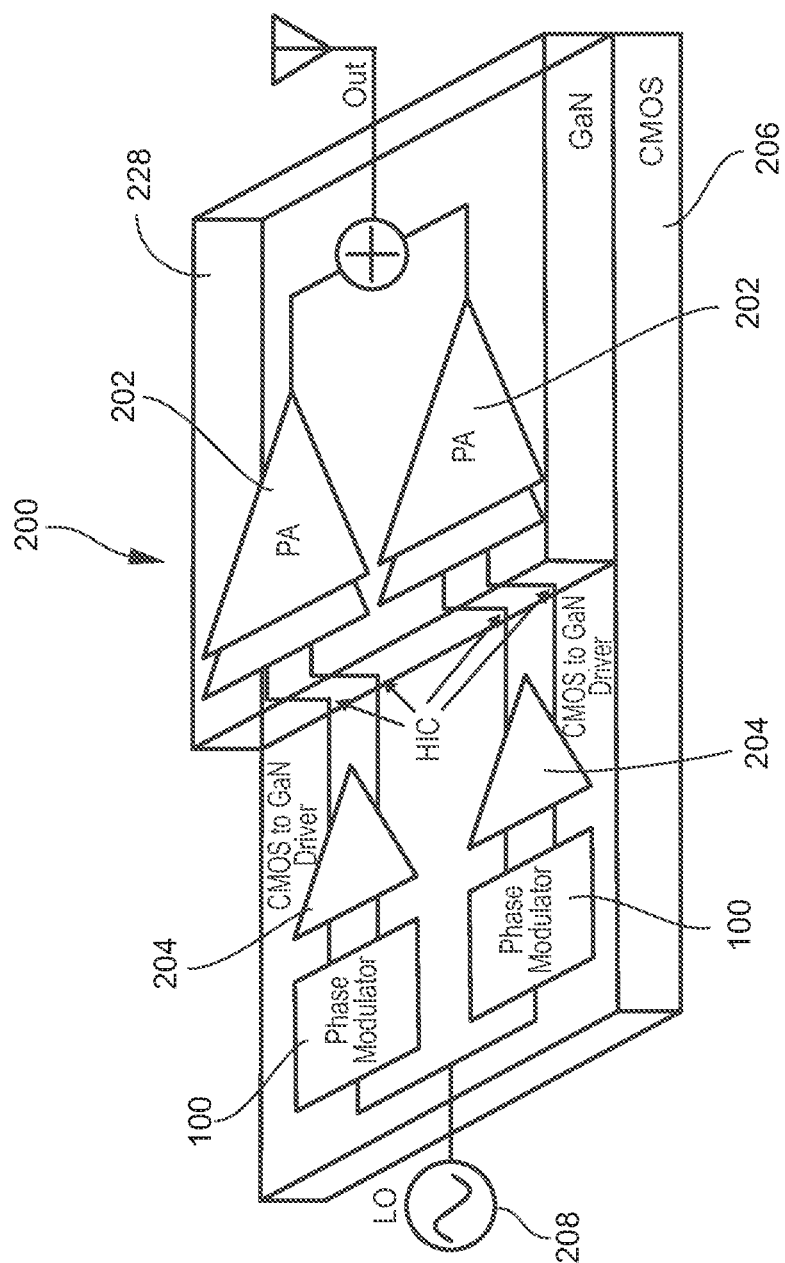
FIG. 8 is a schematic diagram illustrating a two-channel, out-phasing transmitter using a frequency-agile modulator circuit, according to an embodiment herein.
Figure 9:
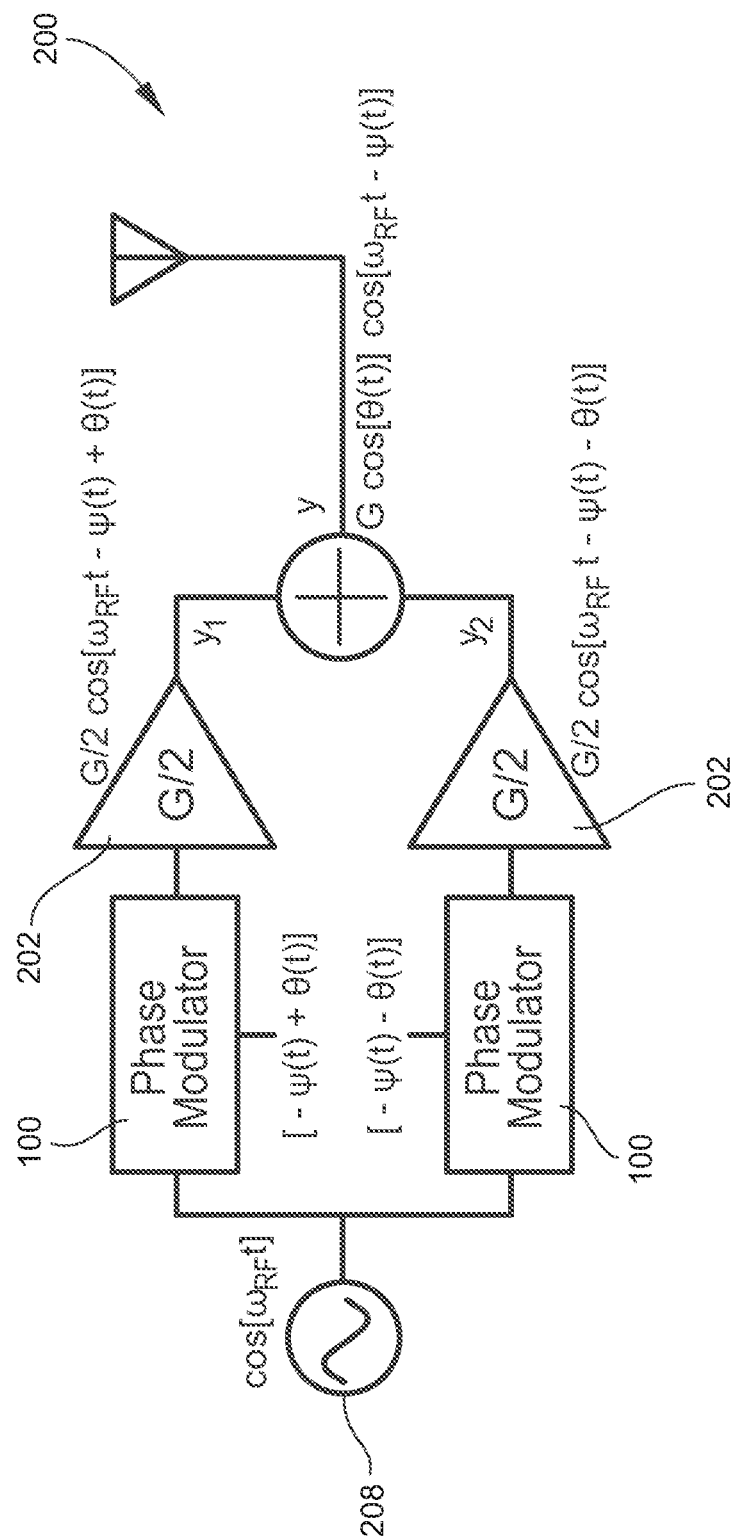
FIG. 9 is a schematic diagram illustrating a two-channel, out-phasing transmitter of FIG. 8, which uses a frequency-agile modulator circuit, showing various signal wave forms, according to an embodiment herein.
Figure 10:
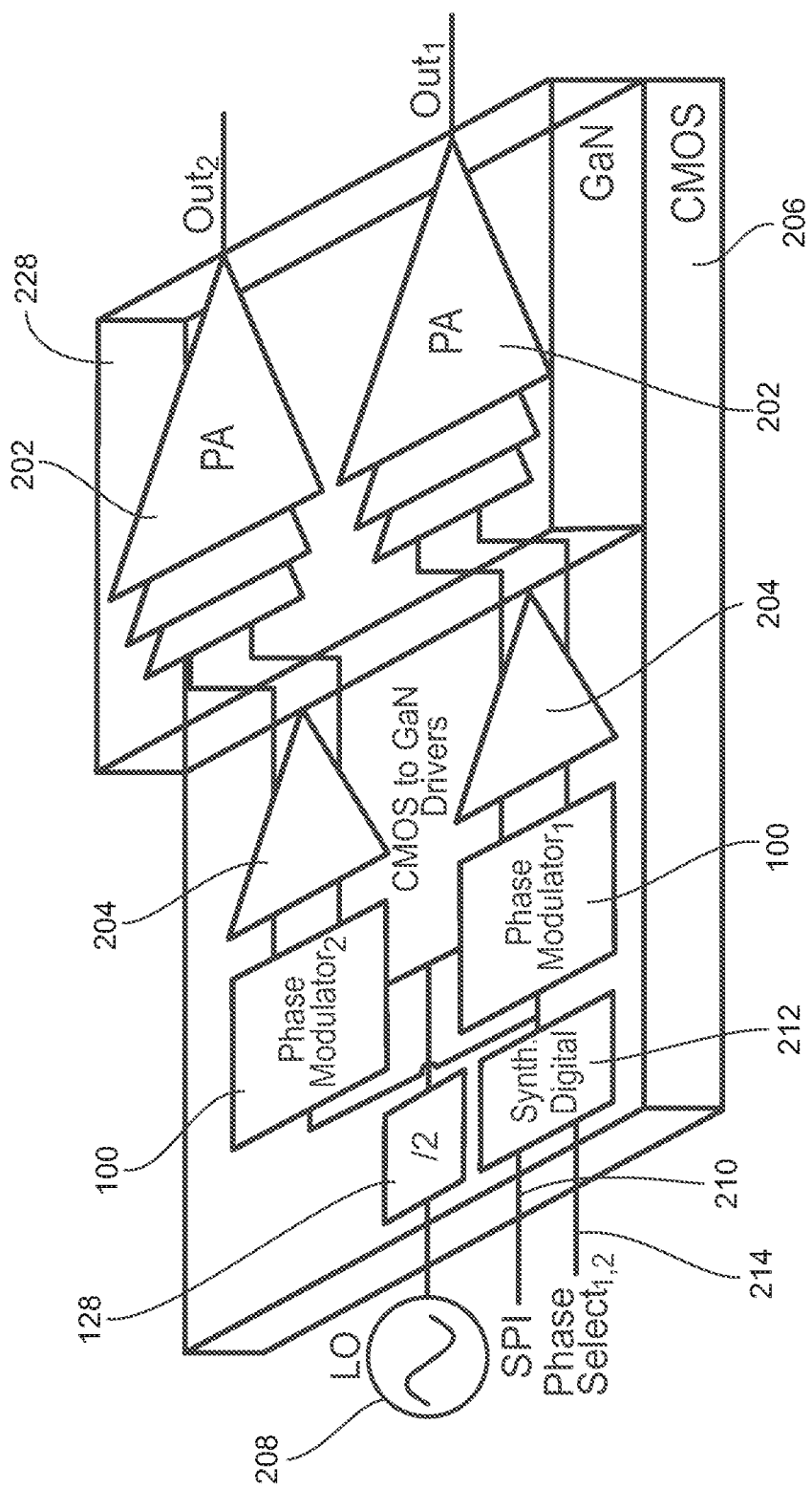
FIG. 10 is a schematic diagram illustrating a two-channel, out-phasing transmitter of FIG. 8, which uses a frequency-agile modulator circuit, showing greater detail of the multiplexer circuit, according to an embodiment herein.

One example of the application of the modulator circuit 100 can be seen in FIGS. 8 through 10. FIG. 10 shows the block diagram for the integrated circuit 206 (IC) constituting the transmitter 200. This IC 206 features two independent phase-modulated channels. The IC 206 is fed an external RF reference tone 105 ($RF_{in}$), which is generated by the local oscillator 208 (LO), at twice the desired RF frequency for input to the delay line 118 of the modulator 100. An on-chip current-mode logic (CML) divide-by-2 128 is used to provide a 50% duty cycle low phase noise RF reference tone for input to the delay line and as a reference signal to the delay line 118, at an RF frequency that is one half the frequency of the $RF_{in}$ 105. Configuration data for the DLL circuit 102 is externally supplied to a synthesized digital block 212 using a serial peripheral interface 210 (SPI). Phase select data 214 for the phase modulators is also externally supplied to the synthesized digital block 212. The synthesized digital block 212 provides configuration data 107 and modulation/phase select data 113 to the phase modulators 100. To decrease complexity, the phase select data may be transmitted in two 8-bit parallel buses at a low frequency (e.g. 400 MHz). The terms IC, IC chip, and chip are used interchangeably herein.

The phase modulator output is amplified by the CMOS to GaN Drivers 204 to drive the GaN power amplifiers 202 (PA). The GaN PAs 202 consist of three stages: a CML pre-driver, a push-pull driver, and a Class-E PA (power amplifier). The CMOS to GaN Drivers 204 and the GaN power amplifiers 202 are identical to the CMOS to GaN Drivers 304 and the GaN power amplifiers 302, which are described in greater detail below. A field-programmable gate array (FPGA) (not shown) stores and provides the code needed to transmit the SPI configuration and phase select data. Capacitors (not shown) are placed near the IC for the critical external connections to the IC to be bonded to and from these capacitors before being bonded to the IC. The connections may be in the form of wirebond connections or wirebonds. This arrangement decreases the wirebond length and the capacitance helps remove high-frequency noise.

Figure 11:
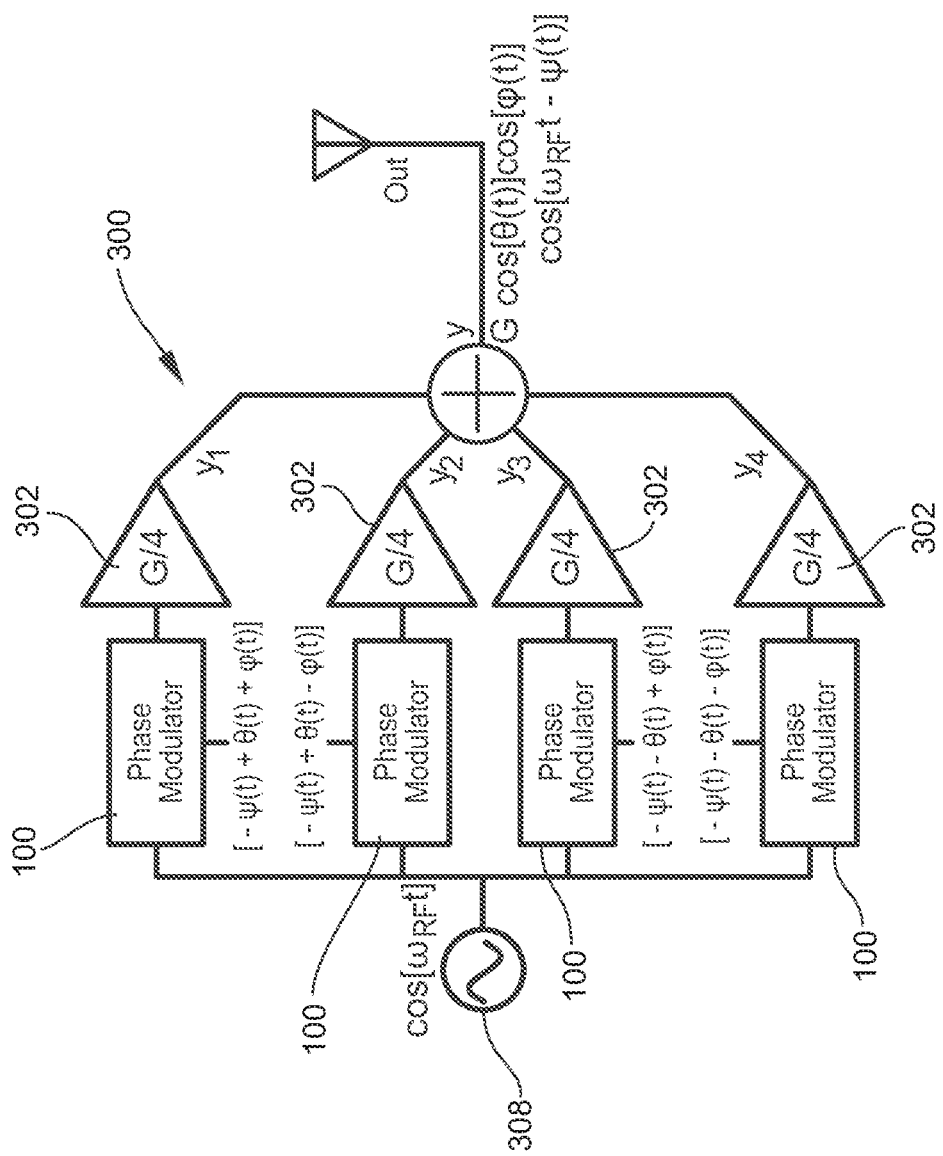
FIG. 11 is a schematic diagram illustrating a four-channel, out-phasing transmitter using a glitch-free, frequency-agile modulator circuit, according to an embodiment herein.
Figure 12:
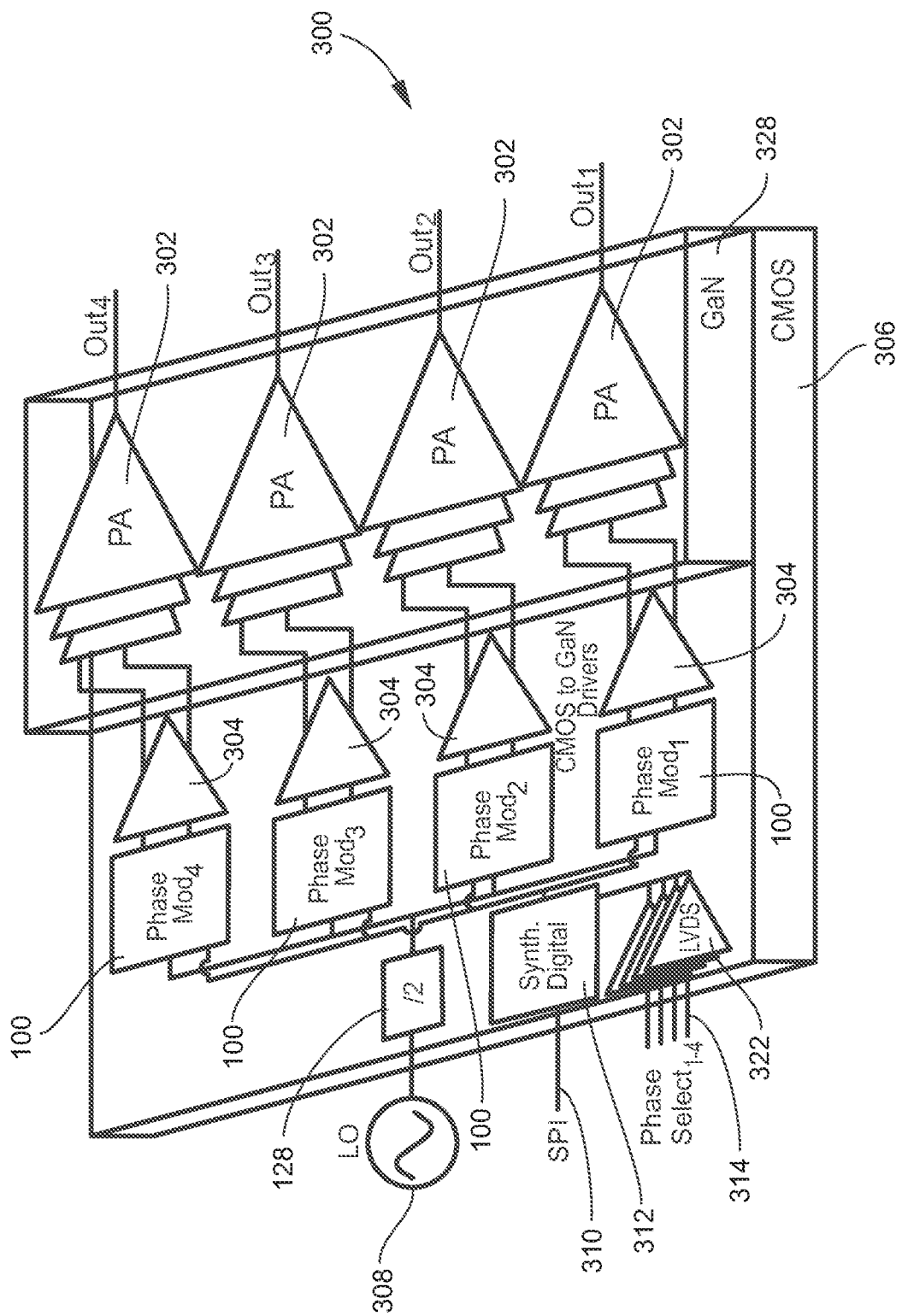
FIG. 12 is a schematic diagram illustrating a four-channel, out-phasing transmitter of FIG. 11, which uses a glitch-free, frequency-agile modulator circuit, showing greater detail of the multiplexer circuit, according to an embodiment herein.

Referring to FIGS. 11 and 12, an exemplary embodiment of a transmitter 300 that utilizes the modulator circuit 100 can be seen. The transmitter 300 has four channels. The transmitter 300 includes an IC chip 306 that integrates at least the silicon based CMOS modulator circuits and III-V semiconductor power amplification circuits on a common substrate. The CMOS portion of the chip is capable of supporting operation from 2.2 to 10.4 GHz, with 8-10-bit phase resolution offered across this range. The IC 306 is fed an external RF reference tone 105 ($RF_{in}$), which is generated by the local oscillator 308 (LO), at twice the desired RF frequency for input to the delay line 118 of the modulator 100. An on-chip current-mode logic (CML) divide-by-2 128 is used to provide the low phase noise RF reference tone for input to the delay line and as a reference signal to the delay line 118, at an RF frequency that is one half the frequency of the $RF_{in}$ 105. Configuration data for the DLL circuit 102 is externally supplied to a synthesized digital block 312 using a serial peripheral interface 310 (SPI). Phase select data 314 for the phase modulators is also externally supplied to the synthesized digital block 312. The synthesized digital block 312 provides configuration data 107 and modulation/phase select data 113 to the phase modulators 100. To reduce the I/O overhead for the phase select data, it is currently preferred to transmit the phase select data 314 over serial high-speed low-voltage differential signaling (LVDS) channels 322 to the synthesized digital block 312; however, low-speed parallel data transmission may be used as an alternative as with transmitter 200. The CMOS to GaN driver 304 and GaN power amplifier 302 (PA) are discussed in greater detail below. The transmitter 300 has an 8-10 bit phase resolution.

The transmitters 200 and 300 take advantage of interfacing dissimilar device technologies. The GaN PAs 302 each consist of three stages: a differential CML pre-driver 316, a push-pull inverting driver 318, and a Class-E GaN power amplifier (PA) 320. The GaN class-E PA 320 requires a 5V swing for proper switching performance, but the thick-gate 45 nm CMOS devices have a break-down voltage of only 1.5V. To overcome this technology interfacing problem, the architecture shown in FIGS. 13-15 was developed. The phase modulated RF signal 121 ($PM_{out}$) is fed from the CMOS modulator circuits 100 to the CMOS to GaN drivers 304 which amplify the 1V square-wave CMOS signal to the differential square-wave signal with 2.5V single-ended swing needed to drive the first stage 316 of the GaN amplifiers 302 while maintaining the signal's phase resolution fidelity.

The CML CMOS to GaN driver 304 is used to drive the 0-1V differential CMOS signal up to a differential signal with 2.5V single-ended swing. The thin-gate input devices, M1 and M2, are utilized for high speed switching operation, commutating the tail current $I_B$ through R1 and R2. The input signal 121 ($PM_{out}$) is AC coupled to the input devices M1 and M2 to allow M1 and M2 to be biased independent of the input signal 121. The values of the current and the resistors are chosen for the desired 2.5V output signal swing. Thick-gate cascode devices, M3 and M4, are used to prevent breakdown of the input switches M1 and M2.

The issue of die interface parasitics also has to be overcome by this circuit. The heterogeneous interconnects (HICs) between the dies, offers approximately 500 fH of inductance instead of the higher parasitics associated with traditional interfacing technologies like wirebonds. Despite offering lower parasitics, HICs can still limit the RF frequency range of the transmitter. The ideal input signal for the GaN class-E PA is a square wave, so the buffer needs to amplify the fundamental frequency component and the odd harmonics of the CMOS input signal. While the CMOS phase modulator is designed to cover 2.2-10.4 GHz, the maximum frequency of the GaN PA 302 is 6 GHz. This requires the drivers to provide gain up to 30 GHz in order to amplify the fundamental, 3rd, and 5th harmonics. To meet this bandwidth requirement in the presence of the die interface parasitics, peaking inductors 324 and 326 are used. They increase the 3 dB bandwidth from 19.8 GHz to 39.6 GHz, allowing the buffer to drive high-frequency square-wave signals.

Hybrid integrated circuits formed by mounting III-V semiconductor chiplets 328 and 228 on CMOS integrated circuit substrates 306 and 206 using thermal and electrical HICs are described in the publication D. Green et al, "A revolution on the horizon from DARPA: heterogeneous Integration for revolutionary microwave/millimeter-wave circuits at DARPA: progress and future directions," IEEE Microw. Mag., vol. 18, no. 2, pp. 44-59, February 2017, which is incorporated by reference herein in its entirety.

One advantage of developing a fully-integrated transmitter is 50Ω matching is not required to interface the driver stages. The CMOS to GaN driver instead implements a 43Ω resistance in the pull-up path. This lower resistance decreases the RC time constant of the pull-up path, allowing the output to have faster edges and provide gain at higher frequencies.

Figure 13:
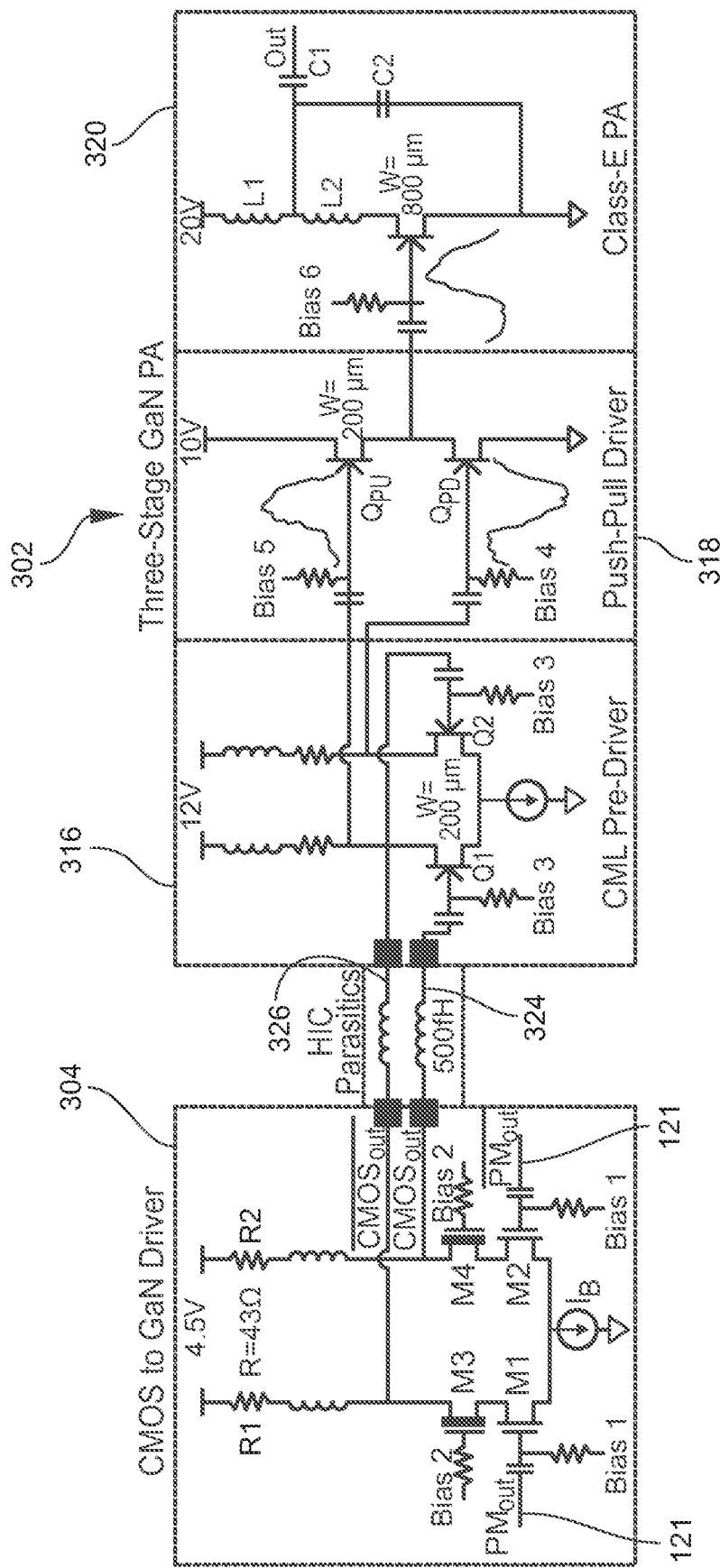
FIG. 13 is a schematic diagram illustrating the CMOS to GaN driver circuit and the GaN power amplifier circuit employed for each channel of the four-channel, out-phasing transmitter of FIG. 12, which uses a glitch-free, frequency-agile modulator circuit, according to an embodiment herein.
Figure 14:
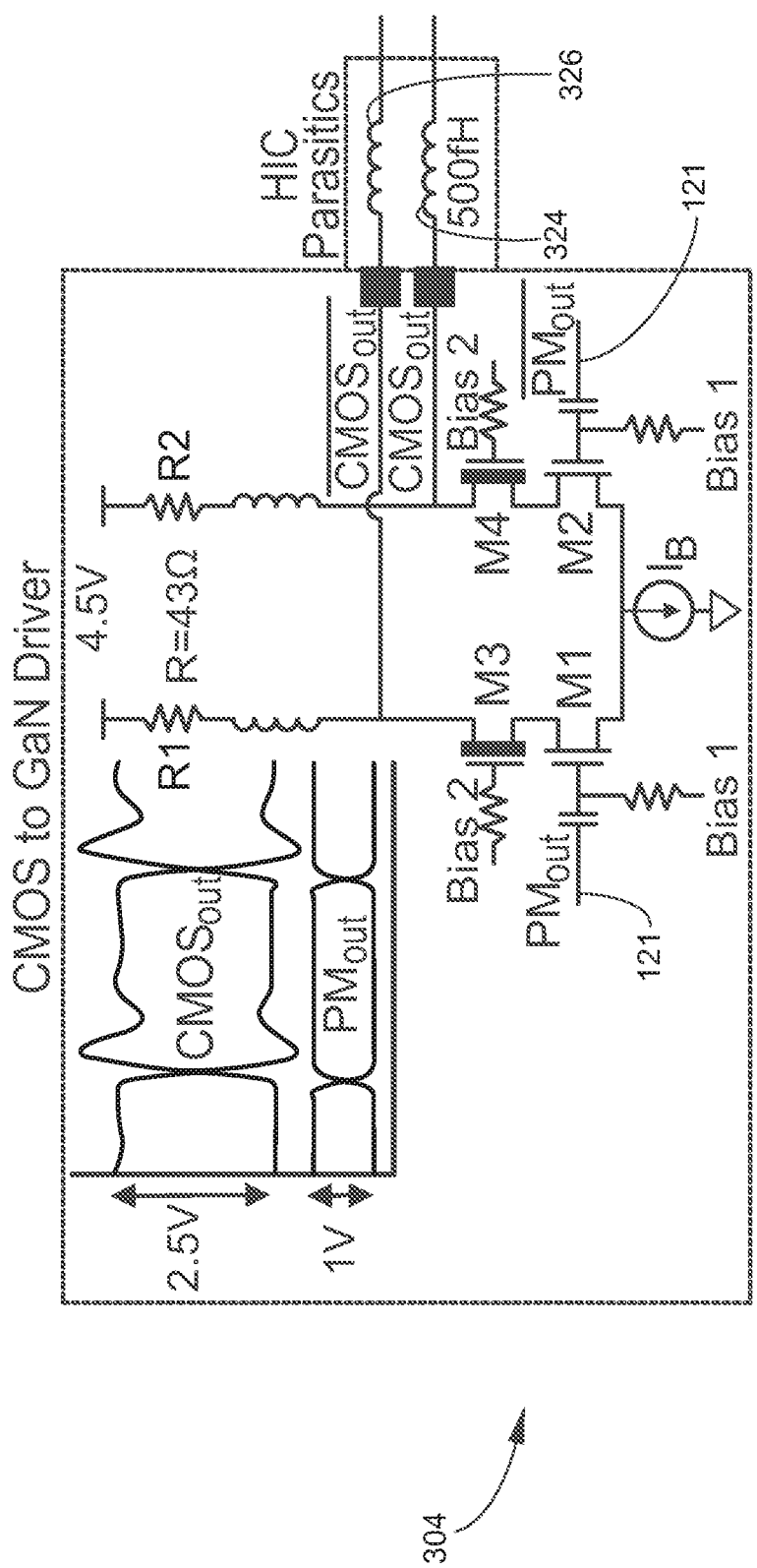
FIG. 14 is a schematic diagram illustrating an enlarged view of the CMOS to GaN driver circuit employed for each channel of the four-channel, out-phasing transmitter of FIG. 12, which uses a glitch-free, frequency-agile modulator circuit, according to an embodiment herein.
Figure 15:
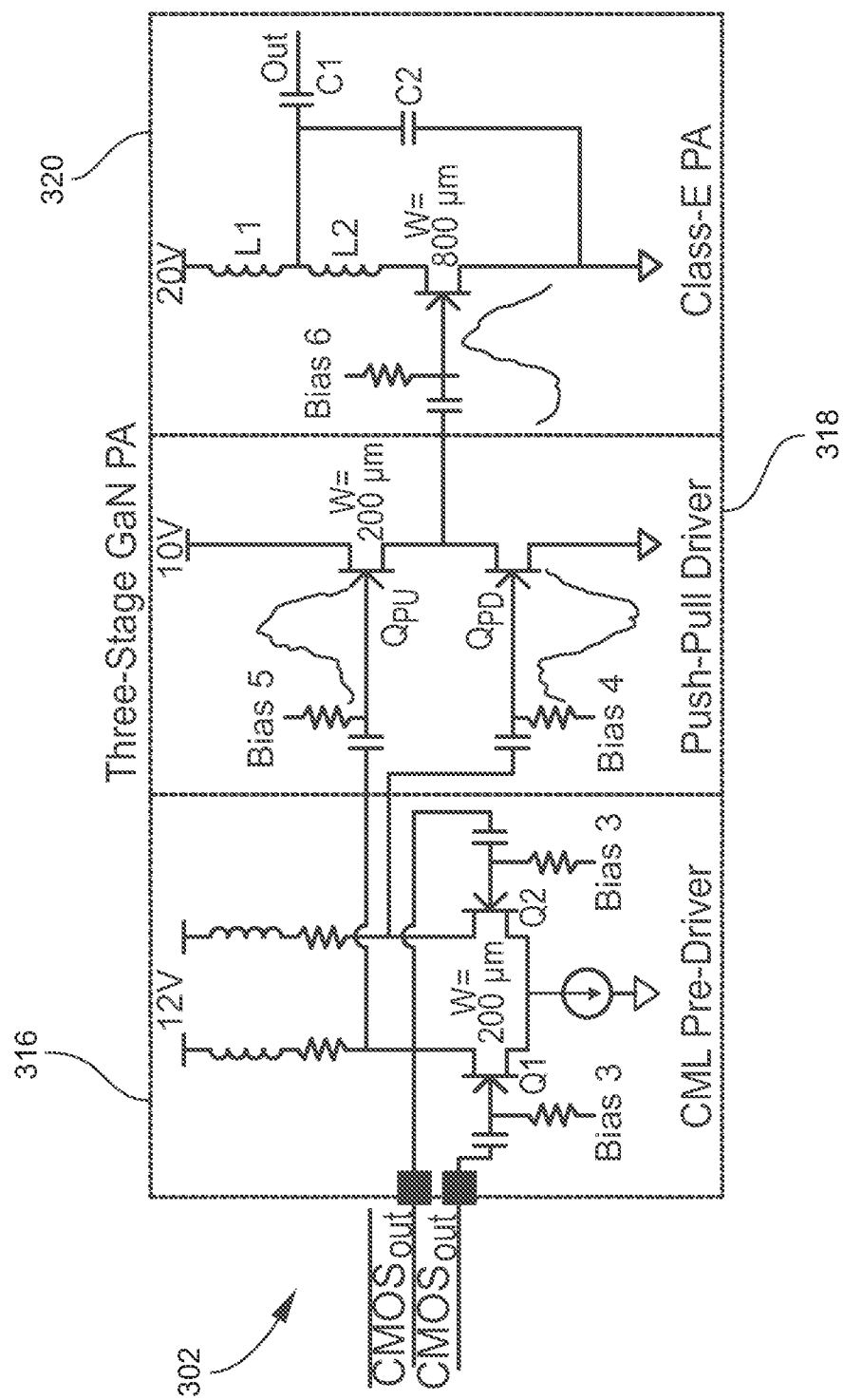
FIG. 15 is a schematic diagram illustrating an enlarged view of the GaN power amplifier circuit employed for each channel of the four-channel, out-phasing transmitter of FIG. 12, which uses a glitch-free, frequency-agile modulator circuit, according to an embodiment herein.

To condition the differential output of the CMOS to GaN drive to the 5V single-ended swing needed to drive the class-E PA 320, two GaN pre-driver stages are implemented (FIGS. 13 and 15). First, there is a GaN CML pre-driver 316 mimicking the CMOS counterpart, which increases the 2.5V output swing of the CMOS CML buffer 304 to the 5V needed to drive the subsequent GaN stages. Note that no cascoding is necessary in the GaN CML pre-driver because of the much greater breakdown voltages of the GaN FETs. Minimum sized devices are chosen for Q1 and Q2 to reduce the capacitive loading on the CMOS driver 304.

One goal of the illustrated embodiment is to maintain the phase fidelity of the signal while efficiently providing the edge-rate necessary to drive the large capacitance of the class-E PAs 320. In CMOS technology, this goal can be achieved using complementary devices (PMOS and NMOS), but in III-V technologies like GaN only depletion-mode n-type devices are available. To circumvent this problem, the illustrated example takes advantage of the readily available differential signal. The differential output of the CML pre-driver 316 drives the push-pull driver 318, which works like an inverting buffer and provides very high edge-rate square-wave signal to the following class-E PA 320. This differential signal drives the pull-up and pull-down switches, QPU and QPD, to ensure that only one is on at a time to prevent shoot-through currents that would degrade the power efficiency. This push-pull topology also converts the differential signal to the 5V single-ended signal needed to drive the class-E PA 320. For a discussion of drivers for class-E PAs, see the article "A wide-band complementary digital Drive for pulse modulated single-ended and differential S/C bands Class-E PAs in 130 nm GaAs technology," by S. Rashid et al, IEEE Compound Semiconductor Integrated Circuits Symp., October 2016, which is incorporated by reference herein in its entirety.

The final stage 320 is a continuous class-E switch-mode power amplifier. See "Continuous class-E power amplifier modes," by M. Ozen et al., IEEE TCAS II: Express Briefs, vol. 59, no. 11, pp. 731-735, November 2012, for a discussion of class-E power amplifiers. L1 and C1 were selected to provide a wideband fundamental 50Ω load match, while series inductor L2 and shunt capacitor C2 were selected to provide the second harmonic termination independent of the fundamental matching. The resulting final stage PA 320 achieves both high output power and power efficiency across a wide output frequency range.

Figure 16:
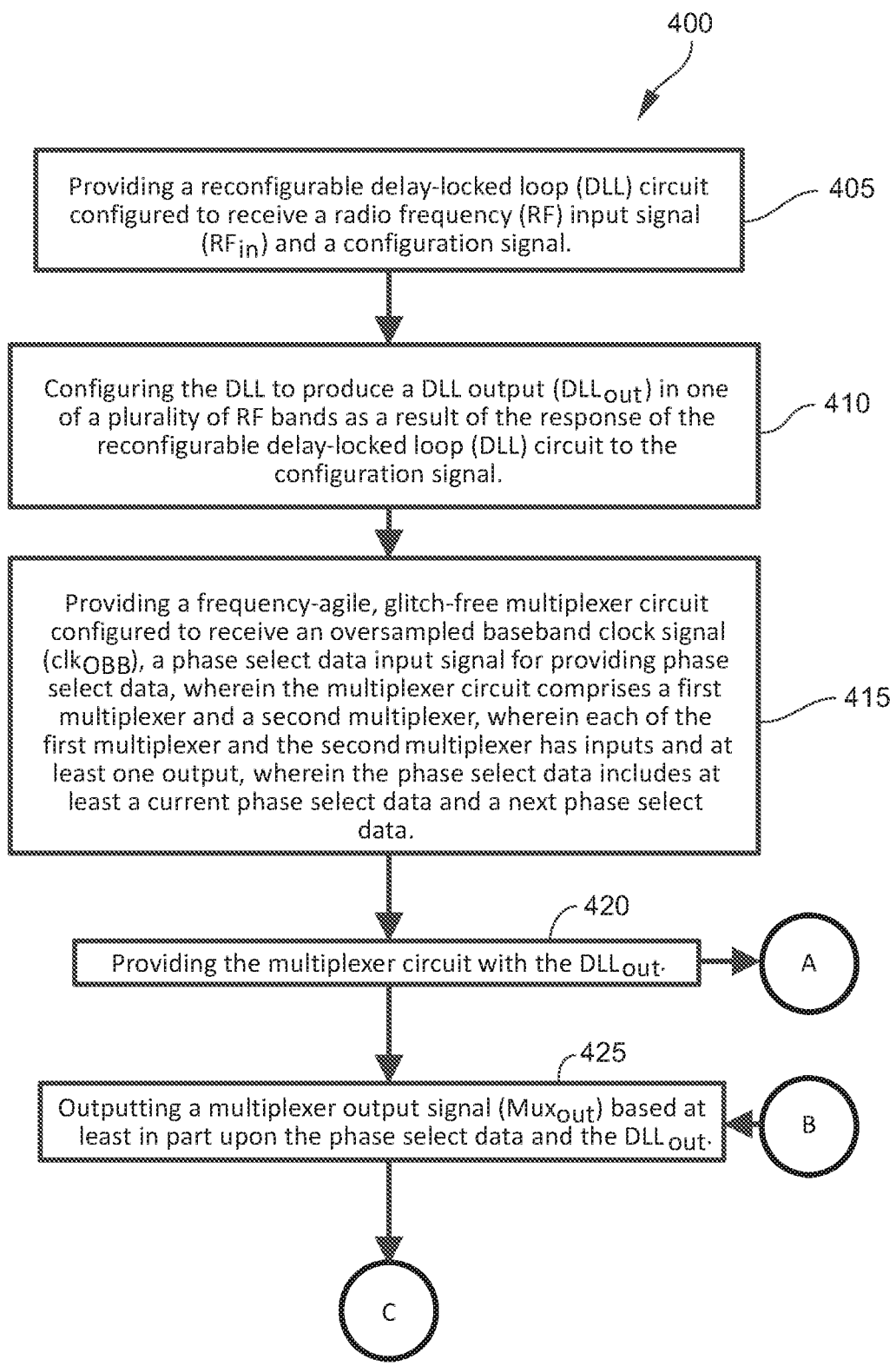
FIG. 16 is a flow diagram illustrating a method for glitch-free modulation of an RF signal across a plurality of frequency bands using a reconfigurable DLL circuit and a glitch-free multiplexer circuit, according to an embodiment herein.

FIG. 16, with reference to FIGS. 1 through 4, illustrates a flow diagram of a method 400 for providing glitch-free signal modulation over multiple RF bands. The method comprises the steps of providing (405) a reconfigurable delay-locked loop (DLL) circuit configured to receive a radio frequency (RF) input signal ($RF_{in}$) and a configuration signal; configuring (410) the DLL to produce a DLL output ($DLL_{out}$) in one of a plurality of RF bands as a result of the response of the reconfigurable delay-locked loop (DLL) circuit to the configuration signal; providing (415) a frequency-agile, glitch-free multiplexer circuit configured to receive an oversampled baseband clock signal ($clk_{OBB}$) and a phase select data input signal for providing phase select data; providing (420) the multiplexer circuit with the $DLL_{out}$; and outputting (425) a multiplexer output signal ($Mux_{out}$) based at least in part upon the phase select data and the $DLL_{out}$. The multiplexer circuit comprises a first multiplexer and a second multiplexer. Each of the first multiplexer and the second multiplexer has inputs and at least one output, and the phase select data includes at least a current phase select data and a next phase select data.

Figure 17:
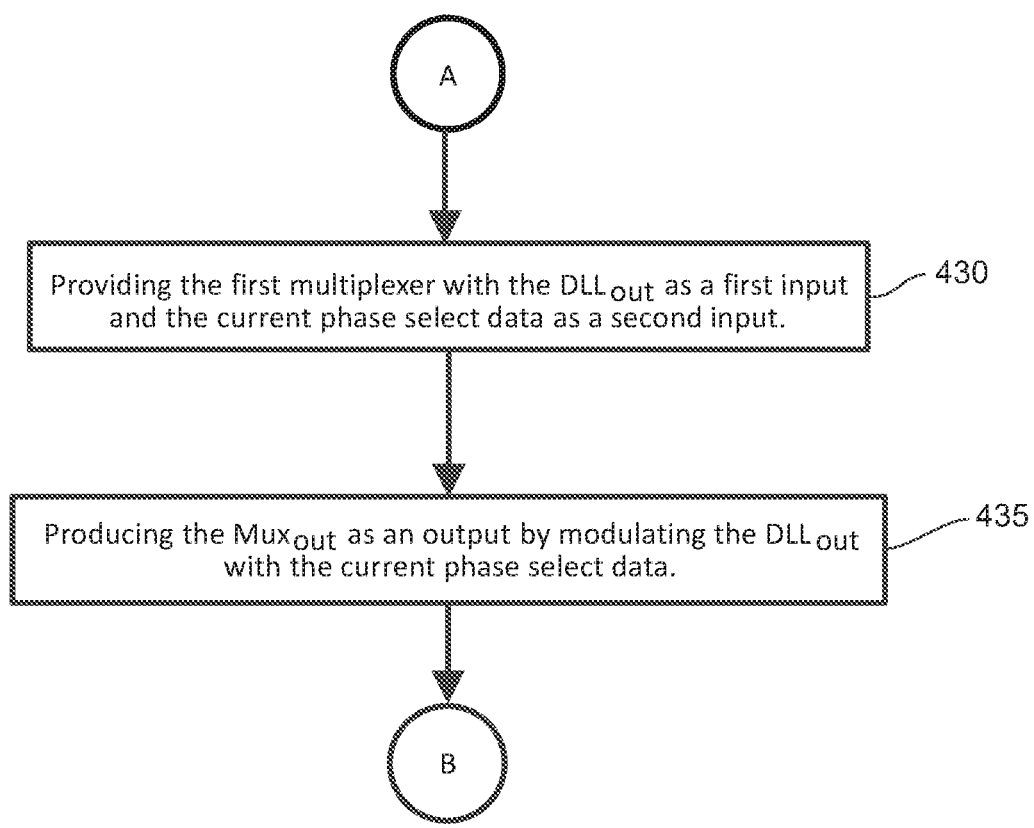
FIG. 17 is a flow diagram illustrating additional steps in a method for glitch-free modulation of an RF signal across a plurality of frequency bands using a reconfigurable DLL circuit and a glitch-free multiplexer circuit, according to an embodiment herein.
Figure 18:
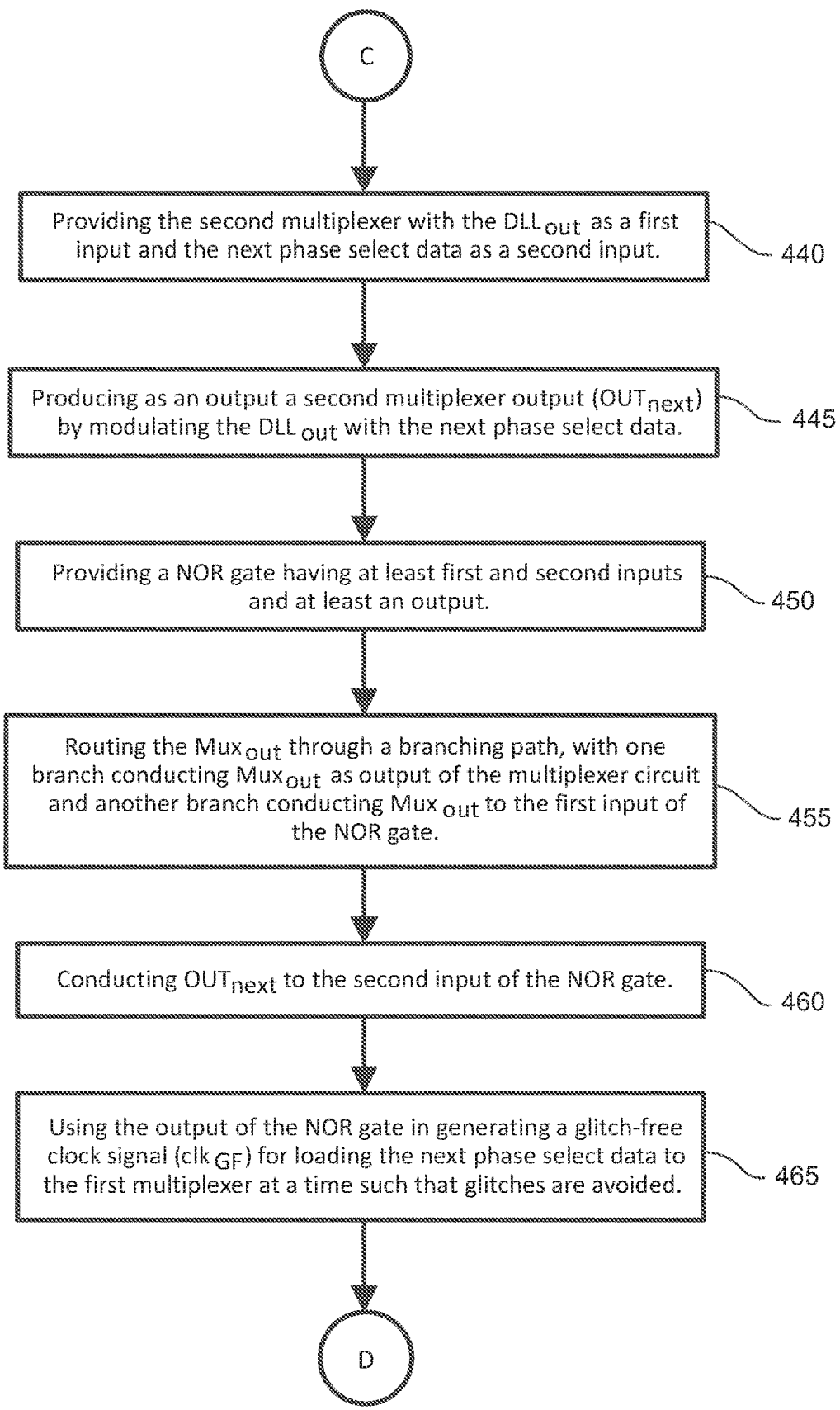
FIG. 18 is a flow diagram illustrating still more steps in a method for glitch-free modulation of an RF signal across a plurality of frequency bands using a reconfigurable DLL circuit and a glitch-free multiplexer circuit, according to an embodiment herein.

As shown in FIGS. 17 and 18, the method 400 may further comprise providing (430) the first multiplexer with the $DLL_{out}$ as a first input and the current phase select data as a second input; producing (435) the $Mux_{out}$ as an output by modulating the $DLL_{out}$ with the current phase select data; providing (440) the second multiplexer with the $DLL_{out}$ as a first input and the next phase select data as a second input; and producing (445) as an output a second multiplexer output ($OUT_{next}$) by modulating the $DLL_{out}$ with the next phase select data.

As shown in FIG. 18, the method 400 may further comprise providing (450) a NOR gate 108 having at least first and second inputs and at least an output; routing (455) the $Mux_{out}$ through a branching path, with one branch conducting $Mux_{out}$ as output of the multiplexer circuit and another branch conducting $Mux_{out}$ to the first input of the NOR gate 108; conducting (460) $OUT_{next}$ to the second input of the NOR gate 108; and using (465) the output of the NOR gate 108 in generating a glitch-free clock signal ($clk_{GF}$) for loading the next phase select data to the first multiplexer at a time such that glitches are avoided.

Figure 19:
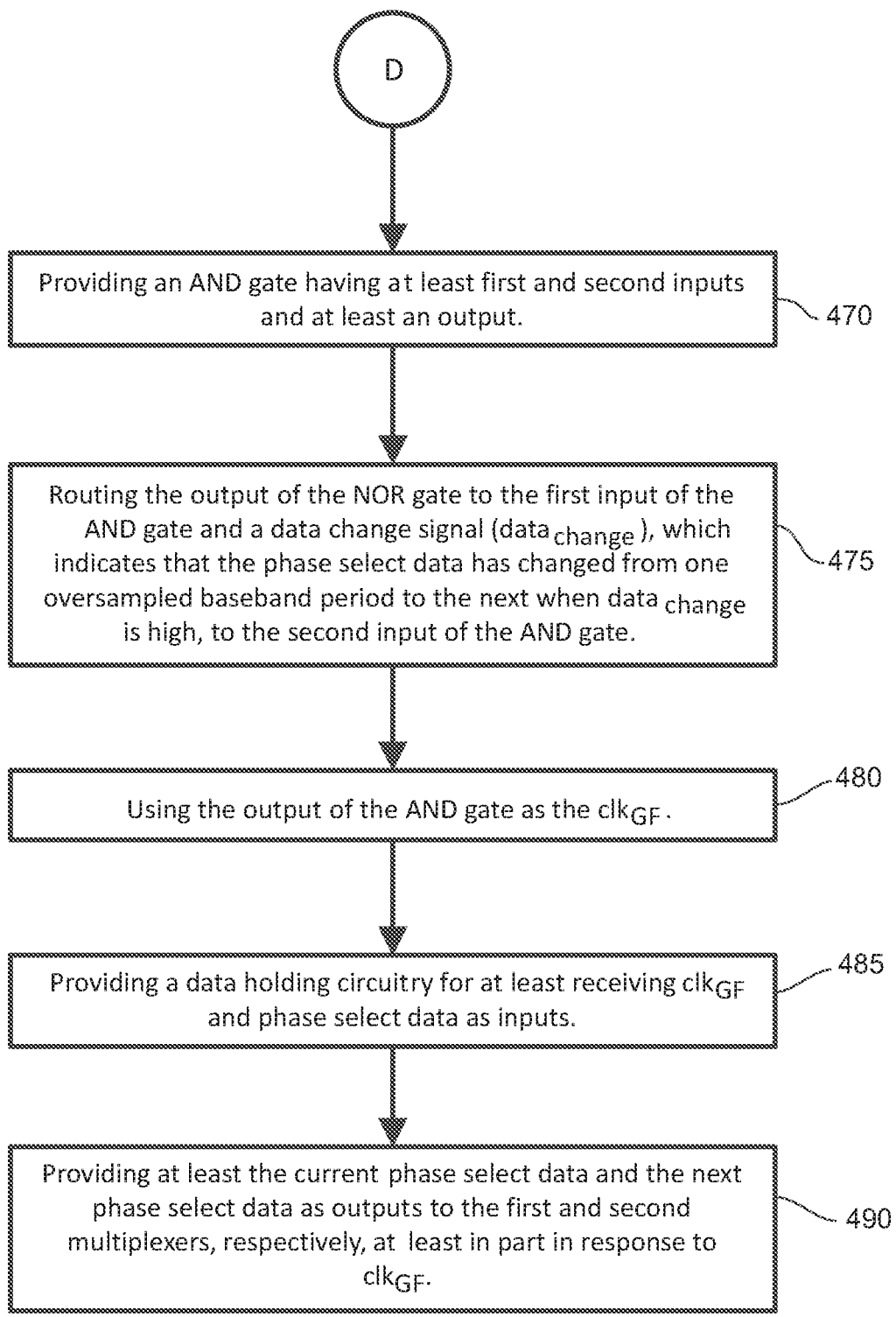
FIG. 19 is a flow diagram illustrating yet further steps in a method for glitch-free modulation of an RF signal across a plurality of frequency bands using a reconfigurable DLL circuit and a glitch-free multiplexer circuit, according to an embodiment herein.

As shown in FIG. 19, the method 400 may further comprise providing (470) an AND gate 110 having at least first and second inputs and at least an output; routing (475) the output of the NOR gate 108 to the first input of the AND gate 110 and a data change signal ($data_{change}$), which indicates that the phase select data has changed from one oversampled baseband period to the next when $data_{change}$ is high, to the second input of the AND gate 110; and using (480) the output of the AND gate 110 as the $clk_{GF}$.

As shown in FIG. 19, the method 400 may further comprise providing (485) a data holding circuitry for at least receiving $clk_{GF}$ and phase select data as inputs; and providing (490) at least the current phase select data and the next phase select data as outputs to the first and second multiplexers, respectively, at least in part in response to $clk_{GF}$.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Those skilled in the art will recognize that the embodiments herein can be practiced with modification within the spirit and scope of the appended claims.

What is claimed is:

1. A phase modulator circuit comprising:
   a reconfigurable delay-locked loop (DLL) circuit configured to receive a radio frequency (RF) input signal ($RF_{in}$) and a configuration signal, wherein the DLL is configured to produce a DLL output ($DLL_{out}$) over a plurality of RF bands, the DLL comprising:
   a delay-line comprising a plurality of inverters, wherein each of the inverters has at least an input and an output, and
   a frequency-select multiplexer ($Mux_{FSel}$), wherein the $Mux_{FSel}$ is configured to receive the configuration signal, wherein the $Mux_{FSel}$ has a plurality of electrical connections to the delay line and a $Mux_{FSel}$ output line that serves as a delay-line output, wherein each of the plurality of electrical connections to the delay line is to the output of a corresponding one of the plurality of inverters, wherein the delay line has a configurable effective delay line length, wherein the configuration signal configures the $Mux_{FSel}$ to adjust the effective length of the delay line by selecting the output of one of the inverters that have their outputs connected to the $\text{Mux}_{FSel}$ to serve as the delay-line output in the DLL; and a frequency-agile, glitch-free multiplexer circuit configured to receive an oversampled baseband clock signal ($\text{clk}_{OBB}$), a phase select data input signal for providing phase select data, and the multiplexer circuit being configured to receive the $\text{DLL}_{out}$ and to output a multiplexer output signal ($\text{Mux}_{out}$) based at least in part upon the phase select data and the $\text{DLL}_{out}$.

2. The phase modulator circuit of claim 1, wherein the $\text{Mux}_{FSel}$ has a plurality of inputs each connected by a respective one of the plurality of the electrical connections to the delay line, wherein the delay-line in the DLL circuit comprises thirty two inverters and the $\text{Mux}_{FSel}$ has at least one input connected to the output of the eighth inverter, at least one input connected to the output of the twelfth inverter, at least one input connected to the output of the sixteenth inverter, at least one input connected to the output of the twentieth inverter, at least one input connected to the output of the twenty fourth inverter, at least one input connected to the output of the twenty eighth inverter, and at least one input connected to the output of the thirty second inverter.

3. The phase modulator circuit of claim 1, wherein the $\text{Mux}_{FSel}$ has a plurality of inputs each connected by a respective one of the plurality of electrical connections to the delay line, wherein there are four inverters between each pair of the plurality of the electrical connections from the $\text{Mux}_{FSel}$ to the delay line.

4. The phase modulator circuit of claim 1, wherein the DLL further comprises:

a current-mode logic (CML) divide-by-2 element used to provide a 50% duty cycle low phase noise RF signal at one half the frequency of the RF input signal ($\text{RF}_{in}$), the low phase noise RF signal serving as input to the delay line and as a reference signal to a first inverter outside the delay line, the first inverter outside the delay line having an output; and a phase detector, the output of the first inverter outside the delay line being electrically connected to one input of the phase detector via a replica multiplexer ($\text{Mux}_{rep}$), the delay-line output being electrically connected to another input of the phase detector, the $\text{Mux}_{rep}$ providing a delay in the reference signal to match the delay due to the $\text{Mux}_{FSel}$ in the delay-line output.

5. The phase modulator circuit of claim 4, wherein the DLL further comprises:

a charge pump having inputs and outputs; and a loop filter having inputs and outputs, wherein the phase detector has outputs, the outputs of the phase detector being electrically connected to the inputs of the charge pump, the outputs of the charge pump being electrically connected to the inputs of the loop filter, and the outputs of the loop filter being electrically connected to each of the inverters in the delay line.

6. The phase modulator circuit of claim 5, wherein the $\text{DLL}_{out}$ comprises a plurality of signal paths, the output of every other inverter in the delay line, beginning with the first inverter in the delay line and ending with the next to the last invertor in the delay line, being electrically connected to a respective one of the plurality of signal paths in the $\text{DLL}_{out}$ via a corresponding inverter outside the delay line.

7. The phase modulator circuit of claim 1, wherein the multiplexer circuit comprises:

a first multiplexer and a second multiplexer,
wherein each of the first multiplexer and the second multiplexer has inputs and at least one output,
wherein the phase select data includes at least a current phase select data and a next phase select data,
wherein the first multiplexer receives the $\text{DLL}_{out}$ as a first input and the current phase select data as a second input and produces the $\text{Mux}_{out}$ as an output, wherein the current phase select data modulates the $\text{DLL}_{out}$ to produce the $\text{Mux}_{out}$,
wherein the second multiplexer receives the $\text{DLL}_{out}$ as a first input and the next phase select data as a second input and produces as an output a second multiplexer output ($\text{OUT}_{next}$), and
wherein the next phase select data modulates the $\text{DLL}_{out}$ to produce the $\text{OUT}_{next}$; and a NOR gate having at least first and second inputs and at least an output, wherein $\text{Mux}_{out}$ is routed through a branching path, with one branch conducting $\text{Mux}_{out}$ as output of the multiplexer circuit and another branch conducting $\text{Mux}_{out}$ to the first input of the NOR gate, wherein $\text{OUT}_{next}$ is conducted to the second input of the NOR gate and the output of the NOR gate is used in generating a glitch-free clock signal ($\text{clk}_{GF}$) for loading the next phase select data to the first multiplexer at a time such that glitches are avoided.

8. The phase modulator circuit of claim 7, wherein the multiplexer circuit further comprises an AND gate having at least first and second inputs and at least an output, wherein the output of the NOR gate is routed to the first input of the AND gate and a data change signal ($\text{data}_{change}$), which indicates that the phase select data has changed from one oversampled baseband period to the next when $\text{data}_{change}$ is high, is conducted to the second input of the AND gate, and the output of the AND gate provides the $\text{clk}_{GF}$.

9. The phase modulator circuit of claim 8, wherein the multiplexer circuit further comprises data holding circuitry at least receiving $\text{clk}_{GF}$ and phase select data as inputs and providing at least the current phase select data and the next phase select data as outputs to the first and second multiplexers, respectively, at least in part in response to $\text{clk}_{GF}$.

10. The phase modulator circuit of claim 9, wherein the data holding circuitry comprises at least one flip-flop.

11. A transmitter circuit comprising:

a phase modulator circuit comprising:

a reconfigurable delay-locked loop (DLL) circuit configured to receive a radio frequency (RF) input signal ($\text{RF}_{in}$) and a configuration signal, wherein the DLL is configured to produce a DLL output ($\text{DLL}_{out}$) over a plurality of RF bands; and a frequency-agile, glitch-free multiplexer circuit configured to receive an oversampled baseband clock signal ($\text{clk}_{OBB}$), a phase select data input signal for providing phase select data, and the multiplexer circuit being configured to receive the $\text{DLL}_{out}$ and to output a multiplexer output signal ($\text{Mux}_{out}$) based at least in part upon the phase select data and the $\text{DLL}_{out}$, the multiplexer circuit comprising:

a first multiplexer and a second multiplexer, wherein each of the first multiplexer and the second multiplexer has inputs and at least one output,
wherein the phase select data includes at least a current phase select data and a next phase select data,
wherein the first multiplexer receives the $\text{DLL}_{out}$ as a first input and the current phase select data as a second input and produces the $\text{Mux}_{out}$ as an output, wherein the current phase select data modulates the $DLL_{out}$ to produce the $Mux_{out}$, and wherein the second multiplexer receives the $DLL_{out}$ as a first input and the next phase select data as a second input and produces as an output a second multiplexer output ($OUT_{next}$), wherein the next phase select data modulates the $DLL_{out}$ to produce the $OUT_{next}$; and a NOR gate having at least first and second inputs and at least an output, wherein $Mux_{out}$ is routed through a branching path, with one branch conducting $Mux_{out}$ as output of the multiplexer circuit and another branch conducting $Mux_{out}$ to the first input of the NOR gate, wherein $OUT_{next}$ is conducted to the second input of the NOR gate and the output of the NOR gate is used in generating a glitch-free clock signal ($clk_{GF}$) for loading the next phase select data to the first multiplexer at a time such that glitches are avoided;

a power amplifier having at least an input and an output, wherein the input to the power amplifier is based at least in part on the $Mux_{out}$.

12. The transmitter circuit of claim 11, further comprising a buffer circuit for processing a signal based at least on $Mux_{out}$ to provide a buffer circuit output signal that is suitable as an input signal to the power amplifier.

13. The transmitter circuit of claim 11, wherein the multiplexer circuit further comprises an AND gate having at least first and second inputs and at least an output, wherein the output of the NOR gate is routed to the first input of the AND gate and a data change signal ($data_{change}$), which indicates that the phase select data has changed from one oversampled baseband period to the next when $data_{change}$ is high, is conducted to the second input of the AND gate, and the output of the AND gate provides the $clk_{GF}$.

14. A method for providing glitch-free signal modulation over multiple RF bands, the method comprising:

providing a reconfigurable delay-locked loop (DLL) circuit configured to receive a radio frequency (RF) input signal ($RF_{in}$) and a configuration signal;

configuring the DLL to produce a DLL output ($DLL_{out}$) in one of a plurality of RF bands as a result of the response of the reconfigurable delay-locked loop (DLL) circuit to the configuration signal;

providing a frequency-agile, glitch-free multiplexer circuit configured to receive an oversampled baseband clock signal ($clk_{OBB}$), a phase select data input signal for providing phase select data;

providing the multiplexer circuit with the $DLL_{out}$; and outputting a multiplexer output signal ($Mux_{out}$) based at least in part upon the phase select data and the $DLL_{out}$;

wherein the multiplexer circuit comprises a first multiplexer and a second multiplexer, wherein each of the first multiplexer and the second multiplexer has inputs and at least one output, and wherein the phase select data includes at least a current phase select data and a next phase select data.

15. The method of claim 14, further comprising:

providing the first multiplexer with the $DLL_{out}$ as a first input and the current phase select data as a second input;

producing the $Mux_{out}$ as an output by modulating the $DLL_{out}$ with the current phase select data;

providing the second multiplexer with the $DLL_{out}$ as a first input and the next phase select data as a second input;

producing as an output a second multiplexer output ($OUT_{next}$) by modulating the $DLL_{out}$ with the next phase select data;

providing a NOR gate having at least first and second inputs and at least an output; routing the $Mux_{out}$ through a branching path, with one branch conducting $Mux_{out}$ as output of the multiplexer circuit and another branch conducting $Mux_{out}$ to the first input of the NOR gate; conducting $OUT_{next}$ to the second input of the NOR gate; and using the output of the NOR gate in generating a glitch-free clock signal ($clk_{GF}$) for loading the next phase select data to the first multiplexer at a time such that glitches are avoided.

16. The method of claim 14, further comprising:

providing an AND gate having at least first and second inputs and at least an output;

routing the output of the NOR gate to the first input of the AND gate and a data change signal ($data_{change}$), which indicates that the phase select data has changed from one oversampled baseband period to the next when $data_{change}$ is high, to the second input of the AND gate; and using the output of the AND gate as the $clk_{GF}$.

17. The method of claim 16, further comprising:

providing a data holding circuitry for at least receiving $clk_{GF}$ and phase select data as inputs; and providing at least the current phase select data and the next phase select data as outputs to the first and second multiplexers, respectively, at least in part in response to $clk_{GF}$.

* * * * *